(12) United States Patent
Kim et al.

(10) Patent No.: US 11,950,417 B2
(45) Date of Patent: Apr. 2, 2024

(54) SEMICONDUCTOR DEVICE

(71) Applicant: Samsung Electronics Co., Ltd., Suwon-si (KR)

(72) Inventors: Wukang Kim, Suwon-si (KR); Sejun Park, Yongin-si (KR); Hyoje Bang, Anyang-si (KR); Jaeduk Lee, Seongnam-si (KR); Junghoon Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 203 days.

(21) Appl. No.: 17/172,458

(22) Filed: Feb. 10, 2021

(65) Prior Publication Data

US 2021/0408037 A1    Dec. 30, 2021

(30) Foreign Application Priority Data

Jun. 25, 2020    (KR) ........................ 10-2020-0077629

(51) Int. Cl.
*H01L 29/423*    (2006.01)
*H01L 23/522*    (2006.01)
*H01L 23/535*    (2006.01)
*H01L 27/11524*    (2017.01)
(Continued)

(52) U.S. Cl.
CPC ......... *H10B 43/27* (2023.02); *H01L 23/5226* (2013.01); *H01L 23/535* (2013.01); *H10B 43/35* (2023.02)

(58) Field of Classification Search
CPC .............. H01L 21/764; H01L 27/11551; H01L 27/11575; H01L 27/11578; H01L 27/11556; H01L 27/11524; H01L 27/11529; H01L 27/1157; G11C 16/0483; G11C 17/123; G11C 2213/75

See application file for complete search history.

(56) References Cited

U.S. PATENT DOCUMENTS 9,076,687 B2    7/2015    Lee et al.
10,074,430 B2    9/2018    Sakui
10,381,450 B1 *    8/2019    Yada ................. H01L 27/11529
(Continued)

FOREIGN PATENT DOCUMENTS

CN    109887926 A    6/2019
KR    10-2015-0091918 A    8/2015
KR    10-2015-0140067 A    12/2015

*Primary Examiner* — Mary A Wilczewski
*Assistant Examiner* — Tsz K Chiu
(74) *Attorney, Agent, or Firm* — Muir Patent Law, PLLC

(57) ABSTRACT

A semiconductor device including a stack structure including gate layers and interlayer insulating layers spaced apart in a vertical direction, a channel hole penetrating the stack structure in the vertical direction, a core region extending within the channel hole, a channel layer disposed on a side surface of the core region, a first dielectric layer, a data storage layer and a second dielectric layer, which are disposed between the channel layer and the gate layers, and a pad pattern disposed on the core region, in the channel hole, and in contact with the channel layer. A first horizontal distance between a side surface of a first portion of an uppermost gate layer and an outer side surface of the channel layer is greater than a second horizontal distance between a side surface of a second portion of the uppermost gate layer and an outer side surface of the pad pattern.

4 Claims, 29 Drawing Sheets

(51) Int. Cl.
  *H10B 43/27*    (2023.01)
  *H10B 43/35*    (2023.01)

(56) References Cited

U.S. PATENT DOCUMENTS

| | | | |
|---|---|---|---|
| 10,541,249 B2 | 1/2020 | Chen et al. | |
| 10,741,578 B2* | 8/2020 | Xu | H01L 27/11582 |
| 10,892,280 B2* | 1/2021 | Xu | H01L 27/1157 |
| 11,437,397 B2* | 9/2022 | Jung | H10B 43/10 |
| 11,723,204 B2* | 8/2023 | Kanno | H10B 43/27 |
| | | | 257/314 |
| 2015/0220269 A1 | 8/2015 | Lee et al. | |
| 2016/0005760 A1* | 1/2016 | Lee | H01L 27/11582 |
| | | | 257/324 |
| 2019/0043880 A1* | 2/2019 | Lee | H10B 43/35 |
| 2019/0081060 A1* | 3/2019 | Lu | H10B 43/35 |
| 2019/0355742 A1* | 11/2019 | Maruyama | H10B 41/10 |
| 2020/0111807 A1* | 4/2020 | Xu | H01L 27/1157 |
| 2020/0194458 A1* | 6/2020 | Kim | H01L 29/42368 |
| 2020/0286828 A1* | 9/2020 | Hosotani | H10B 41/10 |
| 2021/0175241 A1* | 6/2021 | Ryu | H01L 27/11582 |
| 2021/0288067 A1* | 9/2021 | Kanamori | H01L 27/11526 |
| 2021/0313344 A1* | 10/2021 | Ryu | H01L 27/11582 |
| 2021/0313427 A1* | 10/2021 | Kim | H01L 25/074 |
| 2022/0068963 A1* | 3/2022 | Lee | H01L 23/528 |
| 2022/0077182 A1* | 3/2022 | Lee | H01L 27/11573 |
| 2022/0093625 A1* | 3/2022 | Jeong | H01L 27/11556 |
| 2022/0123005 A1* | 4/2022 | Lee | H01L 27/11565 |
| 2022/0285372 A1* | 9/2022 | Choi | H01L 27/11556 |

* cited by examiner

SEMICONDUCTOR DEVICE

CROSS-REFERENCE TO RELATED APPLICATION(S)

This application claims the benefit under 35 USC 119(a) of Korean Patent Application No. 10-2020-0077629 filed on Jun. 25, 2020 in the Korean Intellectual Property Office, the entire disclosure of which is incorporated herein by reference for all purposes.

BACKGROUND

1. Field

The present inventive concept relates to a semiconductor device.

2. Description of Related Art

As demands for high performance, high speed and/or multifunctionality of semiconductor devices increase, the degree of integration of semiconductor devices is increasing. To increase the degree of integration of a semiconductor device, instead of disposing gates on a two-dimensional plane, a method of disposing gates in a vertical direction has been proposed.

SUMMARY

Example embodiments provide a semiconductor device having improved electrical characteristics.

According to an example embodiment, a semiconductor device includes a lower structure including a substrate, and circuit elements on the substrate; a pattern structure disposed on the lower structure and including a lower pattern layer, an intermediate pattern layer on the lower pattern layer, and an upper pattern layer on the intermediate pattern layer; a stack structure including gate layers and interlayer insulating layers alternately stacked on the pattern structure in a vertical direction; and a vertical memory structure penetrating through the stack structure in the vertical direction and in contact with the pattern structure. The vertical memory structure includes a core region; a channel layer on a side surface and a bottom surface of the core region; a data storage structure on an outer side surface and a bottom surface of the channel layer; and a pad pattern contacting the channel layer, on the core region. The data storage structure includes a first dielectric layer, a second dielectric layer and a data storage layer between the first dielectric layer and the second dielectric layer, the first dielectric layer is adjacent to the gate layers and the second dielectric layer is in contact with the channel layer, and an upper end of the data storage layer and an upper end of the second dielectric layer overlap an uppermost gate layer, among the gate layers, in a first direction perpendicular to the vertical direction.

According to an example embodiment, a semiconductor device includes a pattern structure; a stack structure including gate layers and interlayer insulating layers spaced apart from each other in a vertical direction, on the pattern structure; a channel hole penetrating through the stack structure in the vertical direction; a core region extending in the vertical direction, within the channel hole; a channel layer disposed on a side surface of the core region; a first dielectric layer, a data storage layer and a second dielectric layer, which are disposed between the channel layer and the gate layers, the first dielectric layer being adjacent to the gate layers, and the second dielectric layer being in contact with the channel layer; and a pad pattern disposed on the core region, in the channel hole, and in contact with the channel layer. An uppermost gate layer, among the gate layers, has a first portion and a second portion on the first portion, the uppermost gate layer has a side surface facing the first dielectric layer, and a first horizontal distance between the side surface of the first portion and an outer side surface of the channel layer is greater than a second horizontal distance between the side surface of the second portion and an outer side surface of the pad pattern.

According to an example embodiment, a semiconductor device includes a substrate; a plurality of word lines spaced apart from each other in a vertical direction, on the substrate; one or a plurality of upper selection gate lines disposed on the plurality of word lines; an upper erase gate line disposed on the one or the plurality of upper selection gate lines; a vertical memory structure penetrating through the plurality of word lines, the one or the plurality of upper selection gate lines and the upper erase gate line in the vertical direction; a contact plug electrically connected to the vertical memory structure, on the vertical memory structure; and a bit line disposed on the contact plug and electrically connected to the contact plug. The vertical memory structure includes a core region, a channel layer on a side surface and a bottom surface of the core region, a data storage structure on an outer side surface and a bottom surface of the channel layer, and a pad pattern disposed on the core region and having a lower surface contacting an upper end of the channel layer, the data storage structure includes a first dielectric layer, a second dielectric layer and a data storage layer between the first dielectric layer and the second dielectric layer, the first dielectric layer is adjacent to the gate lines, and the second dielectric layer is in contact with the channel layer, the first dielectric layer extends to between the pad pattern and the upper erase gate line, the pad pattern overlaps an upper end of the data storage layer and an upper end of the second dielectric layer in the vertical direction, and a lower surface of the pad pattern overlaps the upper erase gate line in a horizontal direction.

BRIEF DESCRIPTION OF DRAWINGS

The above and other aspects, features, and advantages of the present inventive concept will be more clearly understood from the following detailed description, taken in conjunction with the accompanying drawings.

DETAILED DESCRIPTION

Figure 1:
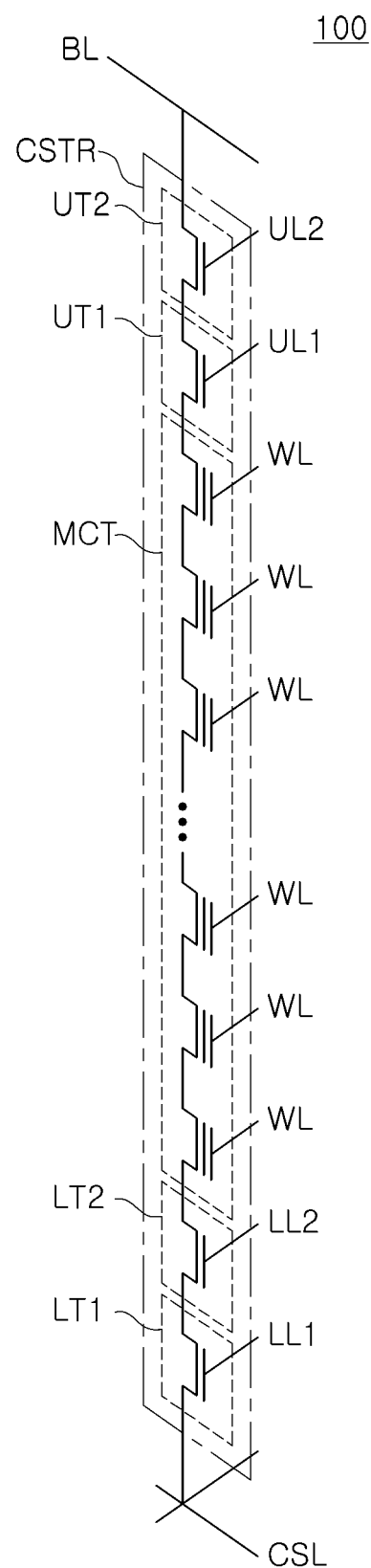
FIG. 1 is a schematic circuit diagram of an example of a semiconductor device according to an example embodiment.

FIG. 1 is a schematic circuit diagram illustrating an example of a semiconductor device according to an example embodiment.

Referring to FIG. 1, a semiconductor device 100 according to an example embodiment may include a bit line BL, a common source line CSL, word lines WL, upper gate lines UL1 and UL2, lower gate lines LL1 and LL2, and a cell string CSTR between the bit line BL and the common source line CSL.

The cell string CSTR may include one or a plurality of lower transistors LT1 and LT2 adjacent to the common source line CSL, one or a plurality of upper transistors UT1 and UT2 adjacent to the bit line BL, and a plurality of memory cell transistors MCT disposed between the one or the plurality of lower transistors LT1 and LT2 and the one or the plurality of upper transistors UT1 and UT2.

The one or the plurality of lower transistors LT1 and LT2, the plurality of memory cell transistors MCT, and the one or the plurality of upper transistors UT1 and UT2 may be connected in series.

In an example, the one or the plurality of upper transistors UT1 and UT2 may include a string selection transistor, and the one or the plurality of lower transistors LT1 and LT2 may include a ground select transistor.

In an example, one or a plurality of lower transistors LT1 and LT2 may include a lower erase control transistor LT1 and a ground select transistor LT2 connected in series. The ground select transistor LT2 may be disposed on the lower erase control selection transistor LT1.

In an example, one or a plurality of upper transistors UT1 and UT2 may include a string selection transistor UT1 and an upper erase control transistor UT2 connected in series. The upper erase control transistor UT2 may be disposed on the string select transistor UT1.

The lower gate lines (LL1 and LL2) may include a first lower gate line LL1 and a second lower gate line LL2, and the upper gate lines (UL1 and UL2) may include a first upper gate line UL1 and a second upper gate line UL2.

The first lower gate line LL1 may be a gate electrode of the lower erase transistor LT1, and the second lower gate line LL2 may be a gate electrode of the ground select transistor LT2. The word lines WL may be gate electrodes of the memory cell transistors MCT, the first upper gate line UL1 may be a gate electrode of the string select transistor UT1, and the second upper gate line UL2 may be a gate electrode of the upper erase transistor UT2.

The erase operation of erasing data stored in the memory cell transistors MCT may use a gate induced drain leakage (GIDL) phenomenon occurring in the lower and upper erase transistors LT1 and UT2. For example, holes generated by a Gate Induced Drain Leakage (GIDL) phenomenon in the lower and upper erase transistors LT1 and UT2 are injected into channels of the memory cell transistors MCT, and data of the memory cell transistors MCT may be erased by the holes injected into the channels of the memory cell transistors MCT. For example, the holes injected into the channels of the memory cell transistors MCT may cause electrons trapped in data storage layers of the memory cell transistors MCT to escape to the channels of the memory cell transistors MCT.

Figure 2:
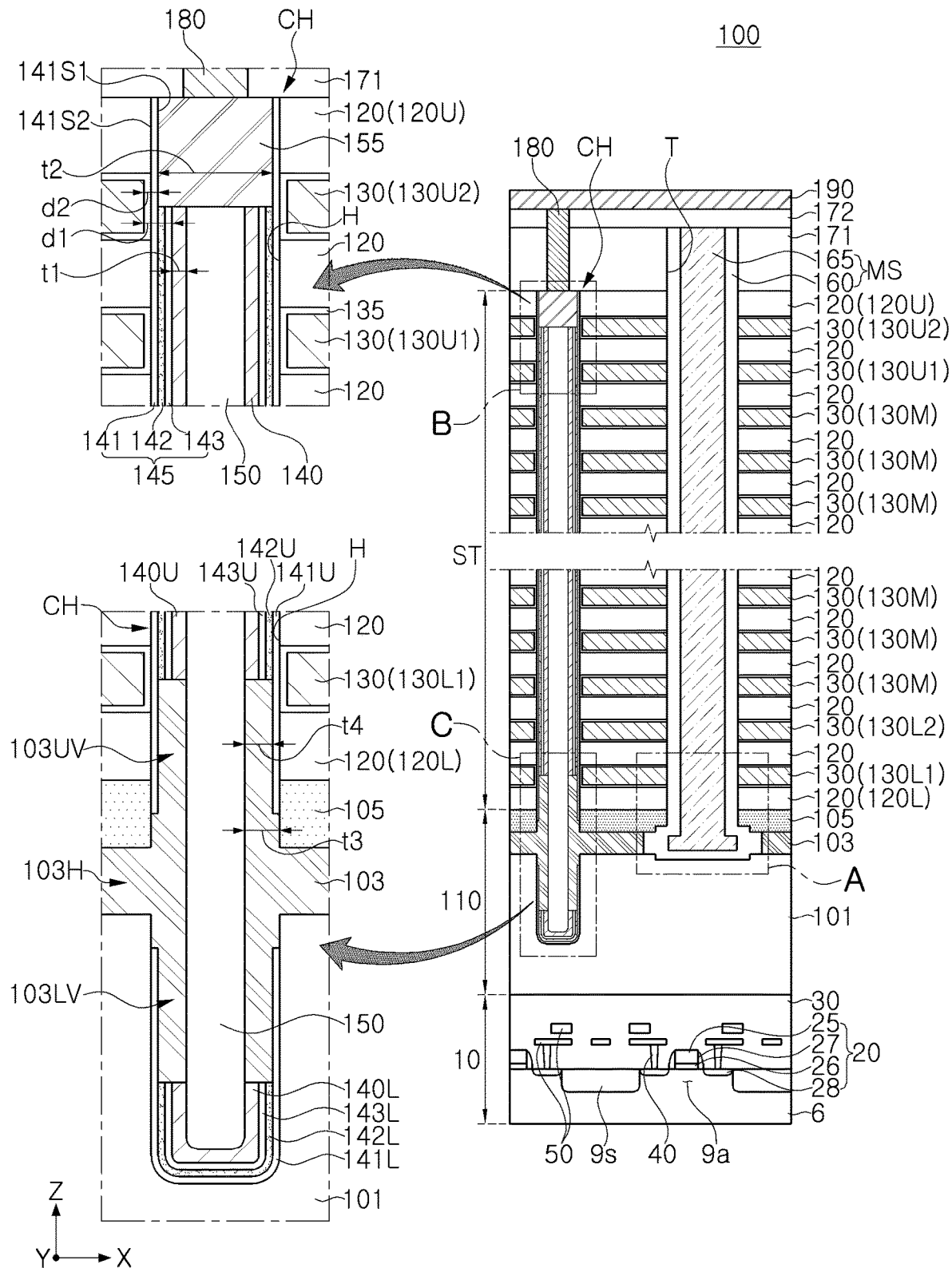
FIG. 2 is a cross-sectional view illustrating an example of a semiconductor device according to an example embodiment.
Figure 3:
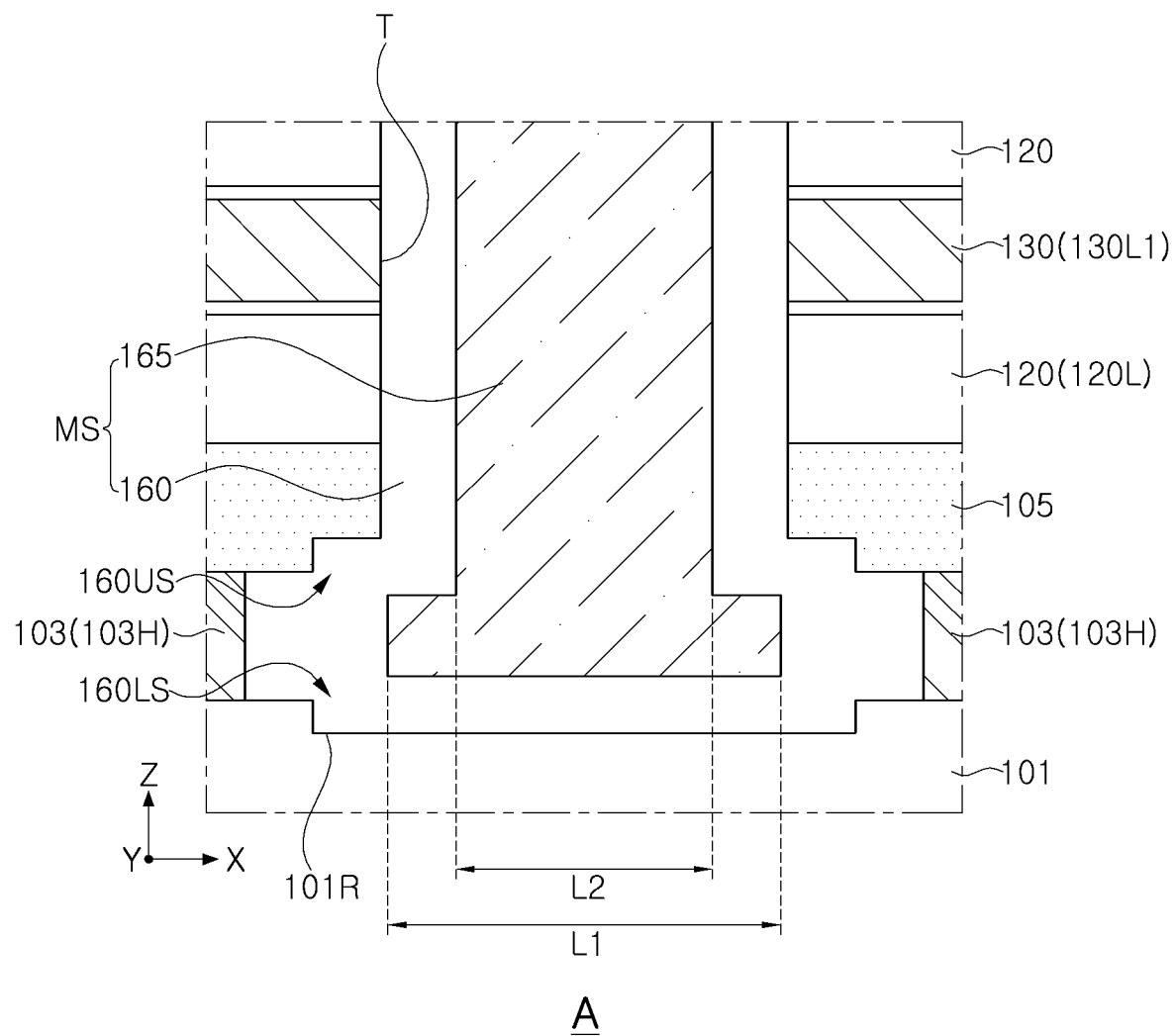
FIG. 3 is a partially enlarged view illustrating an example of a semiconductor device according to an example embodiment.

FIG. 2 is a cross-sectional view illustrating an example of a semiconductor device according to an example embodiment. FIG. 3 is a partially enlarged view illustrating an example of a semiconductor device according to an example embodiment. FIG. 3 illustrates an enlarged view of area A of FIG. 2.

Referring to FIGS. 2 and 3, a semiconductor device 100 may include a lower structure 10, a pattern structure 110 on the lower structure 10, a stack structure ST including interlayer insulating layers 120 and gate layers 130 alternately stacked on the pattern structure 110, a vertical memory structure CH penetrating through the stack structure ST in a vertical direction, and a separation structure MS penetrating through the stack structure ST in the vertical direction and extending in one direction. The semiconductor device 100 may further include capping insulating layers 171 and 172, a contact plug 180, and a bit line 190.

The lower structure 10 may include a substrate 6, circuit elements 20 disposed on the substrate 6, a lower insulating layer 30, circuit contact plugs 40, and circuit wiring lines 50. The circuit elements 20 may be circuit elements for operation of a cell array of a NAND flash memory element.

The substrate 6 may be a single crystal silicon substrate. A device isolation layer 9s may be formed in the substrate 6 to define an active region 9a.

The circuit elements 20 may include a circuit gate 25, a circuit gate insulating layer 26, a spacer layer 27, and circuit source/drain regions 28. The circuit gate 25 may be disposed on the active region 9a defined by the device isolation layer 9s. The circuit source/drain regions 28 may be formed in the active regions 9a on both sides of the circuit gate 25. The circuit gate insulating layer 26 may be disposed between the circuit gate 25 and the active region 9a. The spacer layer 27 may be disposed on both sidewalls of the circuit gate 25.

The lower insulating layer 30 may be disposed on the circuit elements 20, on the substrate 6. The circuit contact plugs 40 may penetrate through the lower insulating layer 30 and may be connected to the circuit source/drain regions 28. Electrical signals may be applied to the circuit elements 20 by the circuit contact plugs 40. The circuit wiring lines 50 may be connected to the circuit contact plugs 40 and may be disposed as a plurality of layers. The circuit elements 20 may be connected to the gate layers 130 through a separate through-region formed in the upper structure and a through-via formed in the through-region.

The pattern structure 110 may include a lower pattern layer 101, an intermediate pattern layer 103 on the lower pattern layer 101, and an upper pattern layer 105 on the intermediate pattern layer 103. The pattern structure 110 may correspond to the common source line CSL described with reference to FIG. 1.

The lower pattern layer 101 may include or may be formed of doped polysilicon. For example, the lower pattern layer 101 may include or may be formed of polysilicon having N-type conductivity.

The intermediate pattern layer 103 may contact the lower pattern layer 101. The intermediate pattern layer 103 may include or may be formed of a silicon layer, for example, a silicon layer having N-type conductivity. The intermediate pattern layer 103 may constitute at least a portion of the common source line CSL as described with reference to FIG. 1.

The upper pattern layer 105 may include or may be formed of a silicon layer, for example, a silicon layer having N-type conductivity.

The stack structure ST may include the interlayer insulating layers 120 and the gate layers 130 that are alternately and repeatedly stacked in a vertical direction Z. The vertical direction Z may be a direction perpendicular to an upper surface of the lower structure 10. The interlayer insulating layers 120 may include or may be formed of an insulating material such as silicon oxide or silicon nitride. Among the interlayer insulating layers 120, an uppermost interlayer insulating layer 120U may have a thickness greater than a thickness of each of the remaining interlayer insulating layers. The gate layers 130 may include or may be formed of at least one of doped silicon, metal nitride (e.g., TiN), a metal (e.g., W), and a metal-semiconductor compound (e.g., TiSi, or WSi). The gate layers 130 may be covered by the barrier layer 135.

In an example, the gate layers 130 may include one or a plurality of lower gate layers 130L1 and 130L2, intermediate gate layers 130M, and one or a plurality of upper gate layers 130U1 and 130U2, on the pattern structure 110. The intermediate gate layers 130M may be disposed on the one or the plurality of lower gate layers 130L1 and 130L2, and the one or the plurality of upper gate layers 130U1 and 130U2 may be disposed on the intermediate gate layers 130M.

The one or the plurality of the lower gate layers (130L1 and 130L2) may include a first lower gate layer 130L1 and a second lower gate layer 130L2 on the first lower gate layer 130L1. The first and second lower gate layers 130L1 and 130L2 may correspond to the first and second lower gate lines LL1 and LL2 described with reference to FIG. 1. The first lower gate layer 130L1 may be a gate electrode of the lower erase transistor LT1 described with reference to FIG. 1. The first lower gate layer 130L1 may be referred to as a 'lowermost gate layer.'

The one or the plurality of the upper gate layers (130U1 and 130U2) may include a first upper gate layer 130U1 and a second upper gate layer 130U2 on the first upper gate layer 130U1. The first and second upper gate layers 130U1 and 130U2 may correspond to the first and second upper gate lines UL1 and UL2 described with reference to FIG. 1. The second upper gate layer 130U2 may be a gate electrode of the upper erase transistor UT2 described with reference to FIG. 1. The second upper gate layer 130U2 may be referred to as an "uppermost gate layer." The second upper gate layer 130U2 may have a greater thickness in the vertical direction Z than a thickness of each of the intermediate gate layers 130M. Among the intermediate gate layers 130M, intermediate gate layers 130M adjacent to the one or the plurality of lower gate layers 130L1 and 130L2 and the one or the plurality of upper gate layers 130U1 and 130U2 may be dummy gate layers. The number of intermediate gate layers 130M may be determined depending on the data storage capacity of the semiconductor device 100.

The vertical memory structure CH may extend in the vertical direction Z and penetrate through the stack structure ST. The vertical memory structure CH may be disposed in a channel hole H penetrating through the stack structure ST and extending into the lower pattern layer 101. The vertical memory structure CH may penetrate through the stack structure ST, the upper pattern layer 105 and the intermediate pattern layer 103 and may extend into the lower pattern layer 101.

In an example, the vertical memory structure CH may form one memory cell string, and may be disposed in plural. The vertical memory structure CH has a column shape, and may have an inclined side surface of which a width is reduced as it approaches the lower structure 10 according to an aspect ratio.

As illustrated in an enlarged view of area B of FIG. 2, the vertical memory structure CH may include a core region 150, a channel layer 140, a data storage structure 145, and a pad pattern 155.

The core region 150 may be spaced apart from a side surface of the channel hole H. The core region 150 extends in the vertical direction Z and may have a side surface facing the gate layers 130, the upper pattern layer 105, and the intermediate pattern layer 103. A lower surface of the core region 150 may be positioned on a lower level than the upper surface of the lower pattern layer 101. The core region 150 may include or may be formed of silicon oxide or a low-k dielectric material.

The channel layer 140 may cover the side surface and the bottom surface of the core region 150. The channel layer 140 may be formed to have an annular shape surrounding the core region 150 within the channel hole H, but according to an example embodiment, the channel layer 140 may also have a column shape such as a cylinder or a prism without the core region 150. The channel layer 140 may have a first horizontal thickness t1 in a first direction (an X direction). In this case, the thickness may indicate a thickness in which the channel layer 140 conformally covers the inner sidewall of the second dielectric layer 143 in the first direction (the X direction). The channel layer 140 may be formed of a semiconductor material layer. For example, the channel layer 140 may be formed of a silicon layer. The channel layer 140 may be an undoped silicon layer or a silicon layer including P-type or N-type impurities.

The data storage structure 145 may be disposed in the channel hole H. The data storage structure 145 may cover an outer side surface and a bottom surface of the channel layer 140. The data storage structure 145 may include a first dielectric layer 141, a data storage layer 142, and a second dielectric layer 143.

The first dielectric layer 141 may be disposed to cover the inner sidewall of the channel hole H. The first dielectric layer 141 may be disposed adjacent to the gate layers 130. A first portion of the first dielectric layer 141 may extend, in the vertical direction Z, between the inner sidewall of the channel hole H and the second upper gate layer 130U2 and the pad pattern 155. A second portion of the first dielectric layer 141 may extend, in the vertical direction Z, between the inner sidewall of the channel hole H and the data storage layer 142. For example, the first portion of the first dielectric layer 141 may contact the second upper gate layer 130U2 and the pad pattern 155. The second portion of the first dielectric layer 141 may contact the data storage layer 142. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

In an example, an upper end (i.e., the first portion) of the first dielectric layer 141 may be positioned on a higher level than an upper end of the data storage layer 142 or an upper end of the second dielectric layer 143 in the vertical direction Z. The upper end of the first dielectric layer 141 may be positioned on a level higher than the upper surface of the second upper gate layer 130U2. The first dielectric layer 141 may extend upwardly of the upper surface of the second upper gate layer 130U2 that is located as an uppermost layer among the gate layers 130, along the inner sidewall of the channel hole H. The first dielectric layer 141 may extend further upwardly than the second dielectric layer 143 in the vertical direction Z, on the outside of the data storage layer 142.

In an example, the first dielectric layer 141 has a first surface 141S1 and a second surface 141S2 opposing each other, and the first surface 141S1 may be in contact with the data storage layer 142 and the pad pattern 155, and the second surface 141S2 may be in contact with the respective gate layers 130. For example, the first surface 141S1 may have a first region in contact with the outer side surface of the data storage layer 142 and a second region in contact with the outer side surface of the pad pattern 155. The second surface 141S2 may be aligned in the vertical direction Z.

The first dielectric layer 141 may include or may be formed of at least one of, for example, silicon oxide ($SiO_x$), silicon nitride ($Si_xN_y$), silicon oxynitride (SiON), aluminum oxide ($AlO_x$), and hafnium oxide ($HfO_x$). In an example, the first dielectric layer 141 may include or may be formed of a high-k material.

The data storage layer 142 may be disposed between the first dielectric layer 141 and the second dielectric layer 143. The data storage layer 142 may be disposed on an inner sidewall of the first dielectric layer 141. The data storage layer 142 may be spaced apart from the channel layer 140.

In an example, an upper end or an upper surface of the data storage layer 142 may overlap the second upper gate layer 130U2 in the first direction (the X direction). The upper end or upper surface of the data storage layer 142 may be located on a level in the vertical direction Z between the upper and lower surfaces of the second upper gate layer 130U2.

The data storage layer 142 may include regions capable of storing data in a semiconductor device such as a NAND flash memory device. For example, the data storage layer 142 may include a material capable of trapping electric charges. For example, the data storage layer 142 may include or may be formed of at least one of silicon nitride ($Si_xN_y$), hafnium oxide ($HfO_x$), and hafnium zirconium oxide (HfZrO).

The second dielectric layer 143 may be disposed between the data storage layer 142 and the channel layer 140. The second dielectric layer 143 may be disposed on and in contact with the inner sidewall of the data storage layer 142.

In an example, the upper end or upper surface of the second dielectric layer 143 may overlap the second upper gate layer 130U2 in the first direction (X direction). The upper end or upper surface of the second dielectric layer 143 may be positioned on a level in the vertical direction Z between the upper and lower surfaces of the second upper gate layer 130U2. The second dielectric layer 143 may tunnel electrical charge to the data storage layer 142. For example, the second dielectric layer 143 may include or may be formed of at least one of silicon oxide ($SiO_x$), silicon nitride ($Si_xN_y$), silicon oxynitride (SiON), aluminum oxide ($AlO_x$), and hafnium oxide ($HfO_x$).

The pad pattern 155 may be disposed on the core region 150. The pad pattern 155 may contact the channel layer 140. The pad pattern 155 may overlap at least a portion of the second upper gate layer 130U2 in the first direction (X direction). The side surface of the pad pattern 155 may be surrounded by and in contact with the first dielectric layer 141. The lower surface of the pad pattern 155 may be located on a level in the vertical direction Z between the upper and lower surfaces of the second upper gate layer 130U2. The pad pattern 155 may have a second horizontal thickness t2 greater than a first horizontal thickness t1 of the channel layer 140 in the first direction (X direction). The pad pattern 155 may include silicon having N-type conductivity, for example, polysilicon.

In an example, the pad pattern 155 may overlap the upper end of the data storage layer 142 and the upper end of the second dielectric layer 143 in the vertical direction (Z). The pad pattern 155 may contact an upper end of the data storage layer 142, an upper end of the second dielectric layer 143, and an upper end of the channel layer 140.

In an example, the lower surface of the pad pattern 155 may overlap the second upper gate layer 130U2 in horizontal directions (X, Y).

In an example, the second upper gate layer 130U2 has a first portion and a second portion on the first portion. The first portion may overlap the data storage layer 142, the second dielectric layer 143 and the channel layer 140 in the first direction (X direction), and the second portion may overlap the pad pattern 155 in the first direction (X direction).

In an example, the first dielectric layer 141, the data storage layer 142, the second dielectric layer 143, and the channel layer 140 may be interposed between the first portion of the second upper gate layer 130U2 and the core region 150.

In an example, the first dielectric layer 141 may be interposed between the second portion of the second upper gate layer 130U2 and the pad pattern 155. Among the first dielectric layer 141, the data storage layer 142 and the second dielectric layer 143, only the first dielectric layer 141 may be interposed between the second portion of the second upper gate layer 130U2 and the pad pattern 155.

In an example, the second upper gate layer 130U2 has a side surface facing the first dielectric layer 141, and a first horizontal distance d1 between the side surface of the first portion and an outer side surface of the channel layer 140 may be greater than a second horizontal distance d2 between the side surface of the second portion and the outer side surface of the pad pattern 155. In this case, the horizontal distance may indicate a distance in the first direction (X direction).

When the second upper gate layer 130U2 operates as a gate electrode of the upper erase transistor UT2 described with reference to FIG. 1, the horizontal thickness of the oxide layer between the second upper gate layer 130U2 and the pad pattern 155 is relatively reduced. Therefore, the efficiency of the erasing operation using the GIDL phenomenon may be improved.

In another example, the horizontal thickness of the oxide layer disposed between the second portion of the second upper gate layer 130U2 and the pad pattern 155 may be different from the horizontal thickness of the first dielectric layer 141 in the first direction (X direction). In this case, the thickness may indicate a thickness in which the first dielectric layer 141 conformally covers the inner wall of the channel hole H.

In another example, a silicon-containing material layer is formed between the second portion of the second upper gate layer 130U2 and the pad pattern 155, and then, the silicon-containing material layer is oxidized to form an oxide layer.

Next, a lower structure of the vertical memory structure CH will be described with reference to an enlarged view of area C of FIG. 2.

The intermediate pattern layer 103 may contact the channel layer 140 while penetrating through the first dielectric layer 141, the data storage layer 142, and the second dielectric layer 143 in the horizontal directions (X, Y). The intermediate pattern layer 103 may penetrate through the channel layer 140 in the horizontal directions (X, Y). The first dielectric layer 141 may be divided into a first lower dielectric layer 141L and a first upper dielectric layer 141U by the intermediate pattern layer 103; the data storage layer 142 may be divided into a lower data storage layer 142L and an upper data storage layer 142U by the intermediate pattern layer 103; and the second dielectric layer 143 may be divided into a second lower dielectric layer 143L and a second upper dielectric layer 143U by the intermediate pattern layer 103. The channel layer 140 may be divided into a lower channel layer 140L and an upper channel layer 140U by the intermediate pattern layer 103.

In an example, the intermediate pattern layer 103 may have a horizontal portion 103H, a lower vertical portion 103LV, and an upper vertical portion 130UV. The horizontal portion 103H may be disposed between the lower pattern layer 101 and the upper pattern layer 105. The lower and upper vertical portions 103LV and 103UV are connected to the horizontal portion 103H and may extend in the vertical direction Z within the channel hole H. The upper vertical portion 103UV may extend to between the core region 150 and the upper pattern layer 105 in the vertical direction Z. The upper end of the upper vertical portion 103UV may overlap the first lower gate layer 130L1 that is a lowest layer of the gate layers 130, in the first direction (X direction). The lower end of the lower vertical portion 103LV may be disposed in the lower pattern layer 101. The lower and upper vertical portions 103LV and 103UV may contact a side surface of the core region 150.

The first upper dielectric layer 141U may be disposed between the upper vertical portion 103UV and the first lower gate layer 130L1 and between the upper vertical portion 103UV and a lowermost interlayer insulating layer 120L. The first upper dielectric layer 141U may extend further downwardly of a lower surface of the first lower gate layer 130L1 and a lower surface of the lowermost interlayer insulating layer 120L. A lower end of the first upper dielectric layer 141U may be disposed to overlap the upper pattern layer 105 in the first direction (X direction). The upper vertical portion 103UV may be spaced apart from the first lower gate layer 130L1 by the first upper dielectric layer 141U in a first direction (X direction).

A portion of an outer sidewall of the upper vertical portion 103UV may be covered by the first upper dielectric layer 141U, and the upper vertical portion 103UV may have a step difference by a thickness difference in the first direction (X direction) in a region in contact with the lower end of the first upper dielectric layer 141U. The outer sidewall of the upper vertical portion 103UV may contact the first surface 141S1 of the first dielectric layer 141. For example, the upper vertical portion 103UV may have a third thickness t3 in the first direction (X direction), on a level located between the lower surface of the upper pattern layer 105 and the lower end of the first upper dielectric layer 141U, and may have a fourth thickness t4 less than the third thickness t3 in the first direction (X direction), on a level located between the lower end of the upper channel layer 140U and the lower end of the first upper dielectric layer 141U. For example, the third thickness t3 may be substantially equal to the combined widths of the upper channel layer 140U, the second upper dielectric layer 143U, the upper data storage layer 142U, and first upper dielectric layer 141U. The fourth thickness t4 may be substantially equal to the combined widths of the upper channel layer 140U, the second upper dielectric layer 143U, and the upper data storage layer 142U. In this case, the thickness may also be referred to as the width. Items described as "substantially the same," "substantially equal," or "substantially planar," may be exactly the same, equal, or planar, or may be the same, equal, or planar within acceptable variations that may occur, for example, due to manufacturing processes.

The upper data storage layer 142U may have a lower surface in contact with the upper end of the upper vertical portion 103UV, and the lower surface of the upper data storage layer 142U may be located on a higher level than the lower surface of the first lower gate layer 130L1 in the vertical direction (Z).

The second upper dielectric layer 143U may have a lower surface in contact with the upper end of the upper vertical portion 103UV, and the lower surface of the second upper dielectric layer 143U may be located on a higher level than the lower surface of the first lower gate layer 130L1 in the vertical direction (Z).

The upper channel layer 140U may have a lower surface in contact with the upper end of the upper vertical portion 103UV, and the lower surface of the upper channel layer 140U may be located on a higher level than the lower surface of the first lower gate layer 130L1 in the vertical direction Z.

In an example, a lower end of the lower vertical portion 103LV may contact upper surfaces of the lower data storage layer 142L, the second lower dielectric layer 143L, and the lower channel layer 140L. The upper surfaces in contact with the lower end of the lower vertical portion 103LV may be located in the lower pattern layer 101. A portion of the outer sidewall of the lower vertical portion 103LV may be covered by the first lower dielectric layer 141L, and may have a step in a region in contact with the upper end of the first lower dielectric layer 141L.

In another example, not illustrated, an upper portion of the vertical memory structure CH may have a structure illustrated in area B of FIG. 2, and a lower portion of the vertical memory structure CH may have a structure different from area C of FIG. 2. For example, the upper end of the upper vertical portion 103UV of the intermediate pattern layer 103 may be positioned on a level between the upper and lower surfaces of the upper pattern layer 105. A lower end of the upper data storage layer 142U and a lower end of the second upper dielectric layer 143U may be located on a level between the upper and lower surfaces of the upper pattern layer 105.

In another example, not illustrated, a lower portion of the vertical memory structure CH may have a structure illustrated in area C of FIG. 2, and an upper portion of the vertical memory structure CH may have a structure different from area B of FIG. 2. For example, an upper end of the data storage layer 142 and an upper end of the second dielectric layer 143 may be positioned on a level higher than the upper surface of the second upper gate layer 130U2. The upper end of the channel layer 140 may be positioned on a level higher than the upper surface of the second upper gate layer 130U2.

The separation structure MS may extend in the vertical direction Z and may penetrate through the stack structure ST. The separation structure MS may extend in the second direction (Y direction). The separation structure MS may be disposed in an isolation trench T penetrating through the first capping insulating layer 171 and the stack structure ST and extending into the lower pattern layer 101. The isolation trench T may extend in the second direction (Y direction). The separation structure MS may penetrate through the stack structure ST, the upper pattern layer 105 and the intermediate pattern layer 103 and extend into the lower pattern layer 101.

The separation structure MS may include a separation core pattern 165 and an isolation spacer 160 on a side surface of the separation core pattern 165.

The isolation spacer 160 may be disposed to cover the inner sidewall of the isolation trench T. The isolation spacer 160 may contact the gate layers 130. The separation core pattern 165 may be spaced apart from the gate layers 130.

The isolation spacer 160 may cover a side surface and a lower surface of the separation core pattern 165.

As illustrated in FIG. 3, the isolation spacer 160 may have an upper horizontal portion 160US extending from a lower portion of the upper pattern layer 105 toward a side surface of the intermediate pattern layer 103. An upper horizontal portion 160S of the isolation spacer 160 may contact a side surface of the horizontal portion 103H of the intermediate pattern layer 103. The upper pattern layer 105 may have a stepped structure in a region adjacent to the isolation spacer 160, and the upper horizontal portion 160US of the isolation spacer 160 covers the lower portion of the upper pattern layer 105 to form a stepped structure.

The isolation spacer 160 may have a lower horizontal portion 160LS below the upper horizontal portion 160US. The lower horizontal portion 160LS of the isolation spacer 160 may contact a side surface of the horizontal portion 103H of the intermediate pattern layer 103. The lower pattern layer 101 may have a recess region 101R below the separation structure MS. The lower horizontal portion 160LS of the isolation spacer 160 may have a stepped structure while covering the recess region 101R.

The separation core pattern 165 may have a lower width L1 greater than an upper width L2 in the first direction (X direction). The lower portion of the separation core pattern 165 may be disposed on a lower level than the upper pattern layer 105. The separation core pattern 165 may have a bent portion due to a difference between the lower and upper widths L1 and L2.

In an example, the separation core pattern 165 and the isolation spacer 160 may be formed of an insulating material.

In an example, the separation core pattern 165 may be formed of a conductive material, and the isolation spacer 160 may be formed of an insulating material.

The first capping insulating layer 171 and the second capping insulating layer 172 may be sequentially stacked on the stack structure ST. The first capping insulating layer 171 and the second capping insulating layer 172 may be formed of an insulating material.

The contact plug 180 may penetrate through the first and second capping insulating layers 171 and 172 and may be electrically connected to the vertical memory structure CH. For example, the contact plug 180 may contact the pad pattern 155 of the vertical memory structure CH. The contact plug 180 may include or may be formed of a conductive material, such as, tungsten (W), copper (Cu), and/or aluminum (Al).

The bit line 190 may be disposed on the second capping insulating layer 172. The bit line 190 contacts the contact plug 180 and may be electrically connected to the vertical memory structure CH through the contact plug 180. The bit line 190 may correspond to the bit line BL described with reference to FIG. 1.

FIGS. 4 to 9 are cross-sectional views illustrating an example of a semiconductor device according to an example embodiment. In this case, descriptions overlapping with those described with reference to FIGS. 2 and 3 will be omitted.

Figure 4:
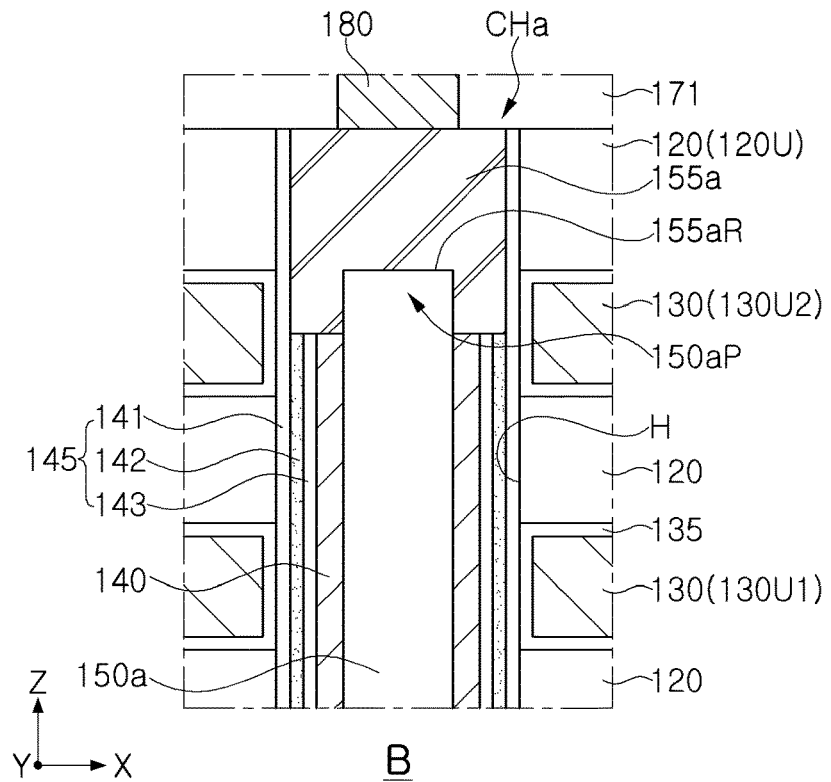
FIGS. 4 to 10 are cross-sectional views illustrating an example of a semiconductor device according to an example embodiment.

Referring to FIG. 4, a structure of a vertical memory structure CHa may be different from that of the example embodiment of FIG. 2. An upper portion 150aP of a core region 150a of the vertical memory structure CHa may further protrude in the vertical direction Z toward the upper surface of a pad pattern 155a than the channel layer 140. The pad pattern 155a may have a pad recess portion 155aR recessed toward the upper surface of the pad pattern 155a.

The pad pattern 155a may have regions having different horizontal thicknesses in the first direction (X direction). For example, the horizontal thickness of the pad pattern 155a in the first direction (X direction) on both sides of the pad recess portion 155aR may be less than the horizontal thickness of the upper portion of the pad pattern 155a. The vertical memory structure CHa of FIG. 4 may be formed by adjusting the etching depth of the core region 150a.

Figure 5:
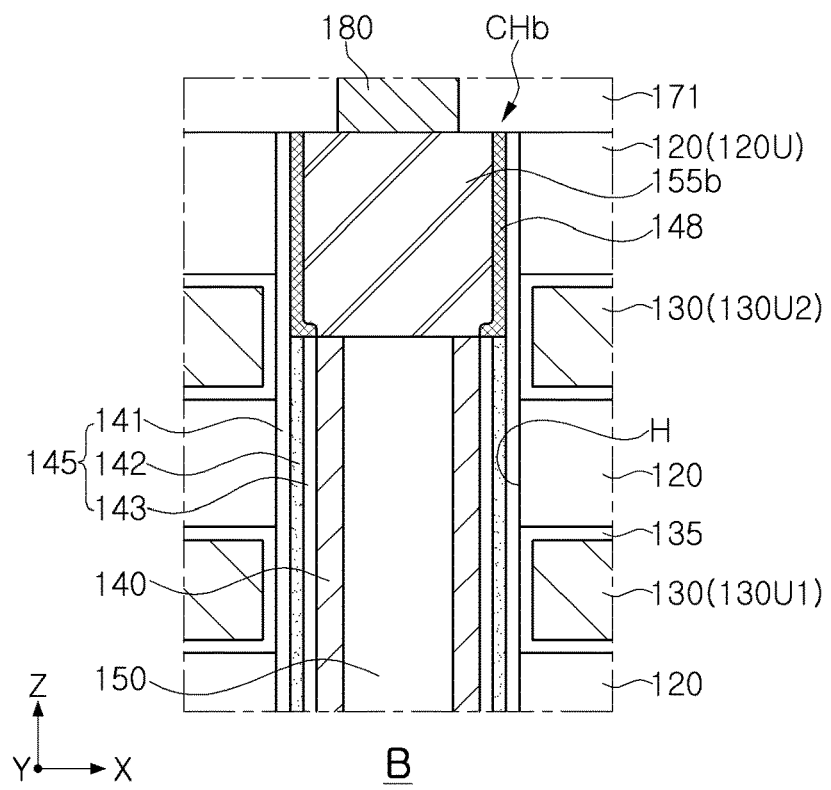

Referring to FIG. 5, a structure of a vertical memory structure CHb may be different from the example embodiment of FIG. 2. The vertical memory structure CHb may further include an insulating layer 148 disposed between the first dielectric layer 141 and a pad pattern 155b. The insulating layer 148 may cover at least a portion of the data storage layer 142 and/or the second dielectric layer 143. The insulating layer 148 may have an 'L' shape or a shape similar thereto. The thickness in the first direction (X direction) of a lower end or lower surface of the insulating material layer 148 interposed between the second upper gate layer 130U2 and the pad pattern 155b may be greater than a thickness in the first direction (X direction) of an upper end or upper surface of the insulating material layer 148 interposed between the uppermost interlayer insulating layer 120U and the pad pattern 155b. The distance between both sides of the pad pattern 155b in the first direction (X direction) may be less than that in the example embodiment of FIG. 2.

The insulating layer 148 may be formed by forming an insulating material layer in the space in which the pad pattern 155b is to be formed, by a deposition process, and by removing a portion of the insulating material layer covering the channel layer 140 and the core region 150 by a trim process. Alternatively, the insulating layer 148 may also be formed by forming a layer including, for example, SiON, in a space in which the pad pattern 155b is to be formed, to then be partially oxidized.

Figure 6:
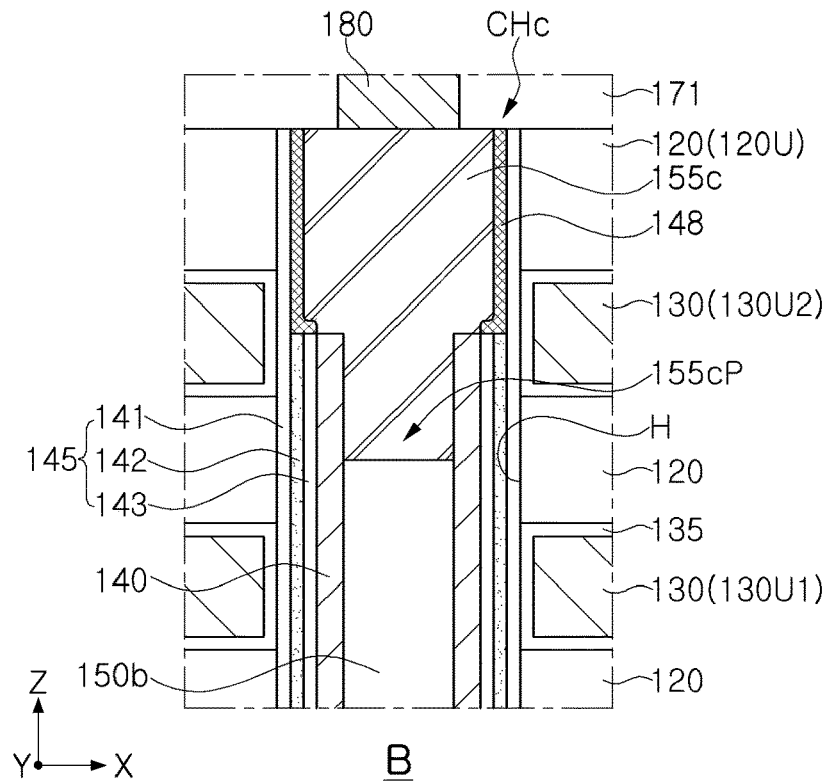

Referring to FIG. 6, a structure of a vertical memory structure CHc may be different from the example embodiment of FIG. 5. The upper surface of a core region 150b of the vertical memory structure CHc may be located on a level lower than the upper end of the channel layer 140. A lower portion 155cP of a pad pattern 155c may extend further downwardly of the upper end of the channel layer 140. A description of a method of forming the insulating layer 148 may be the same as that described with reference to FIG. 4. Electrical characteristics of the vertical memory structure CHc may be improved by an increase in a contact area between the pad pattern 155c and the channel layer 140.

Figure 7:
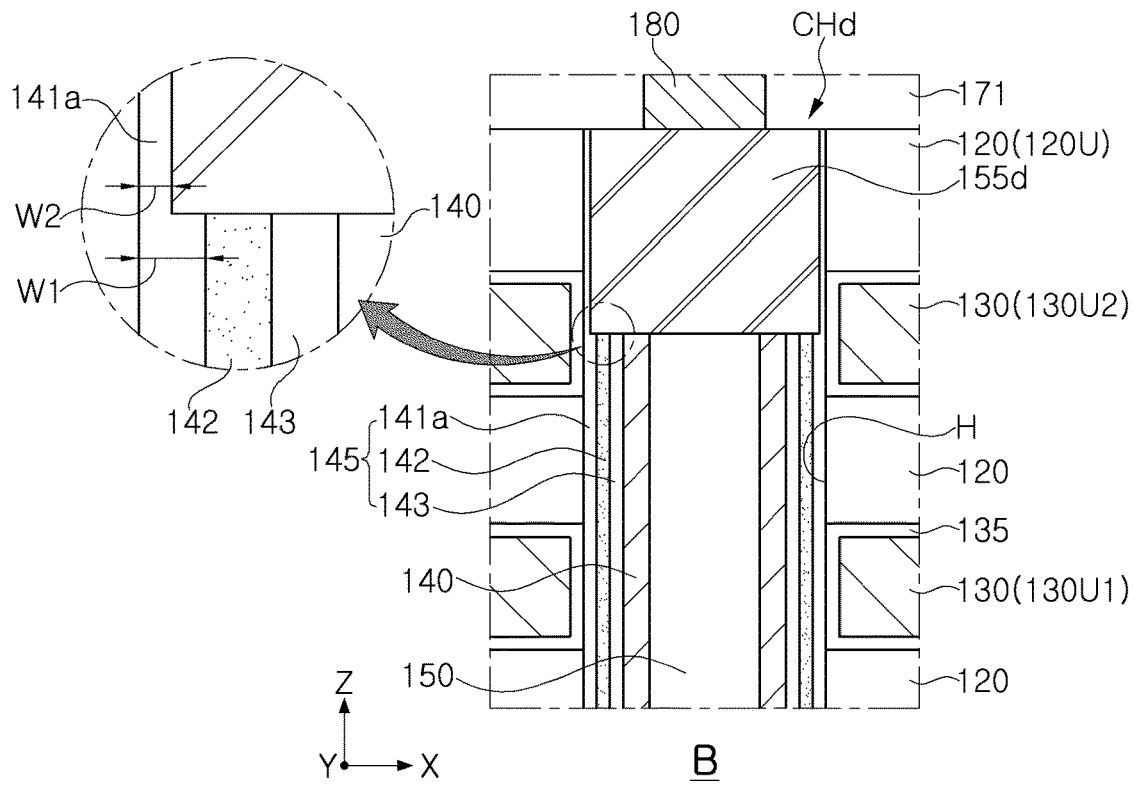

Referring to FIG. 7, a structure of a vertical memory structure CHd may be different from the example embodiment of FIG. 2. A first dielectric layer 141a of the vertical memory structure CHd may have a first thickness W1 in the first direction (X direction) on a level lower than the upper end of the data storage layer 142, and may have a second thickness W2 less than the first thickness W1 in the first direction (X direction) on a level higher than the upper end of the data storage layer 142. A portion of the upper portion of the first dielectric layer 141a is removed from the inner side surface to have a bent portion due to a difference between the first and second thicknesses W1 and W2. The first and second thicknesses may be referred to as first and second widths, respectively. The distance between both ends of the pad pattern 155d in the first direction (X direction) may be larger than that of the example embodiment of FIG. 2.

Figure 8A:
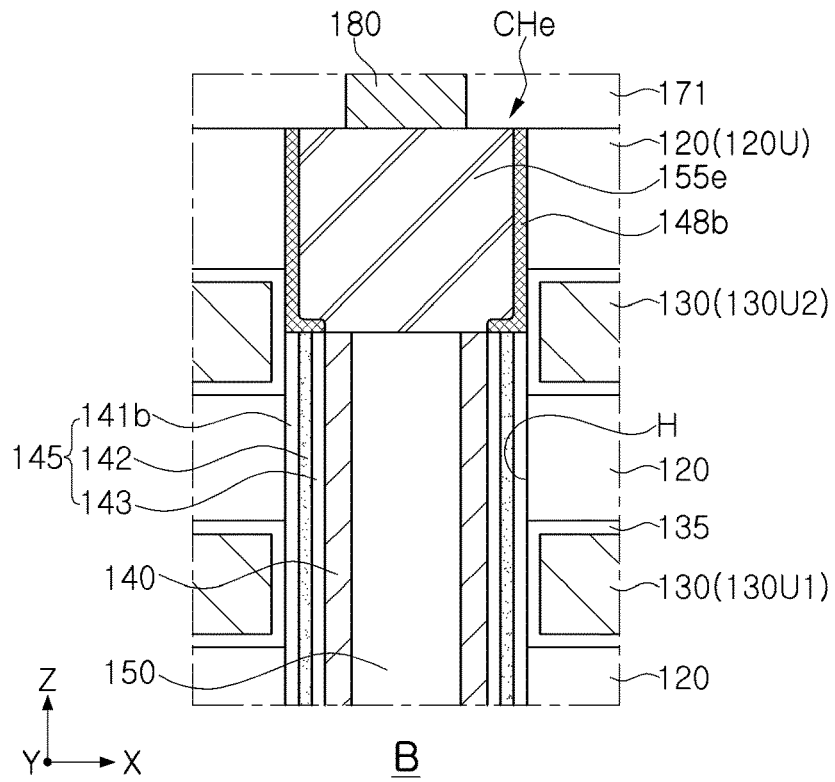

Referring to FIG. 8A, the structure of a vertical memory structure CHe may be different from the example embodiment of FIG. 2. The upper end or upper surface of a first dielectric layer 141b of the vertical memory structure CHe may be located on a level between the lower surface and the upper surface of the second upper gate layer 130U2. The upper end or upper surface of the first dielectric layer 141b may overlap the second upper gate layer 130U2 in the first direction (X direction). An insulating layer 148b may extend in the vertical direction Z while covering an upper end of the first dielectric layer 141b. The insulating layer 148b may be disposed along the inner sidewall of the channel hole H and may contact the second upper gate layer 130U2. The insulating layer 148b may be disposed between the pad pattern 155 and an uppermost interlayer insulating layer 120U. A description of a method of forming the insulating layer 148b may be the same as that described with reference to FIG. 4. A horizontal thickness of the insulating layer 148b in the first direction (X direction) may be substantially the same as or different from a horizontal thickness of the first dielectric layer 141 in the first direction (X direction).

Figure 8B:
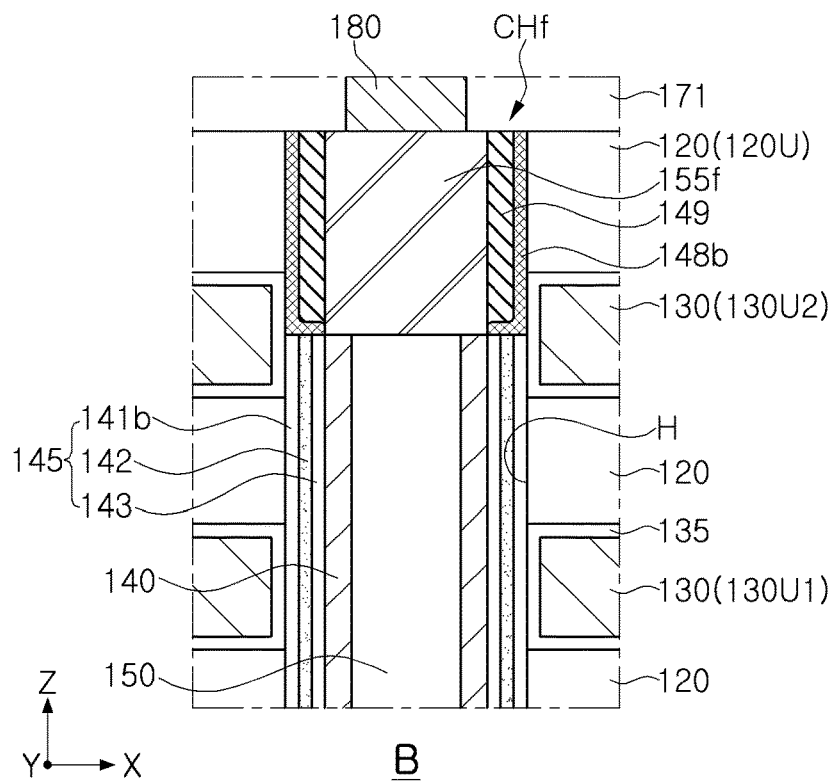

Referring to FIG. 8B, a structure of a vertical memory structure CHf may be different from the example embodiment of FIG. 8A. The vertical memory structure CHf may further include a pad spacer 149 between the insulating layer 148b and a pad pattern 155f. The pad spacer 149 may cover the inner sidewall of the insulating layer 148b. The insulating layer 148b may have an 'L' shape, and the pad spacers 149 may cover a horizontal portion of the insulating layer 148b. The pad spacer 149 may serve as a mask during a trim process. The pad spacer 149 may be formed of or may include, for example, polysilicon or an insulating material.

Figure 9:
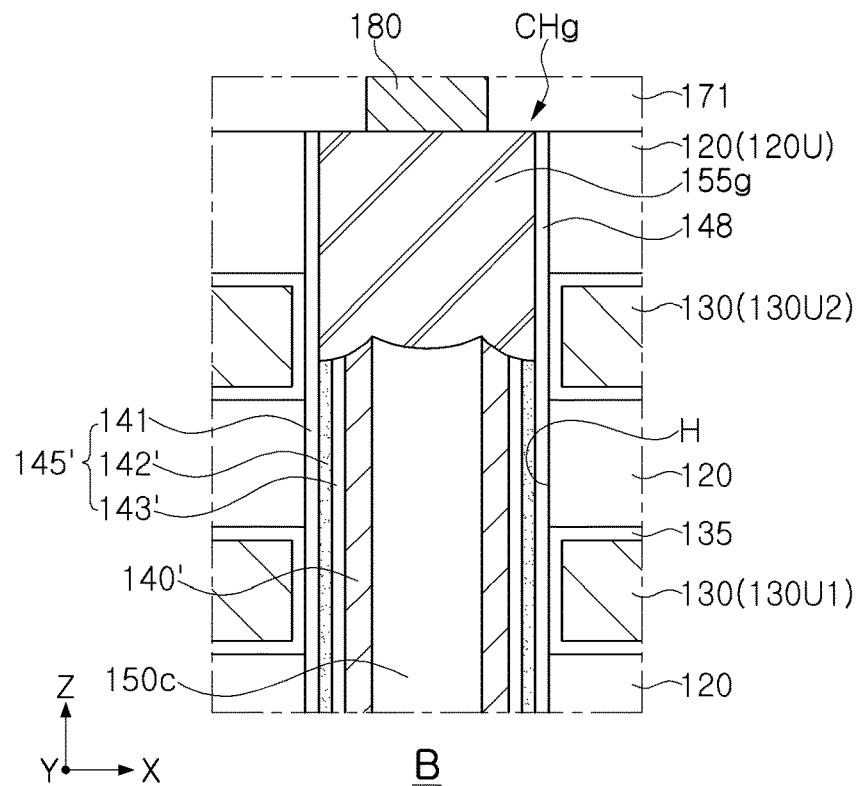

Referring to FIG. 9, the structure of a vertical memory structure CHg may be different from the example embodiment of FIG. 2. A core region 150c may have an upper surface of which a middle portion is concave downwardly from an upper end. Upper surfaces of a data storage layer 142', a second dielectric layer 143', and a channel layer 140' may be inclined with respect to the upper surface of the lower structure 10. For example, with respect to the vertical direction Z, a level of the upper end of the channel layer 140' may be higher than a level of the upper end of the second dielectric layer 143'. The level of the upper end of the second dielectric layer 143' may be higher than a level of the upper end of the data storage layer 142'. A pad pattern 155g may have a lower surface that covers a concave upper surface of the core region 150c, and the inclined upper surfaces of the data storage layer 142', the second dielectric layer 143', and the channel layer 140.' FIG. 9 exemplarily illustrates a shape of the vertical memory structure CHg that may be formed during an etching process, and the shape and arrangement relationship of upper surfaces of respective components may be variously changed according to example embodiments.

Figure 10:
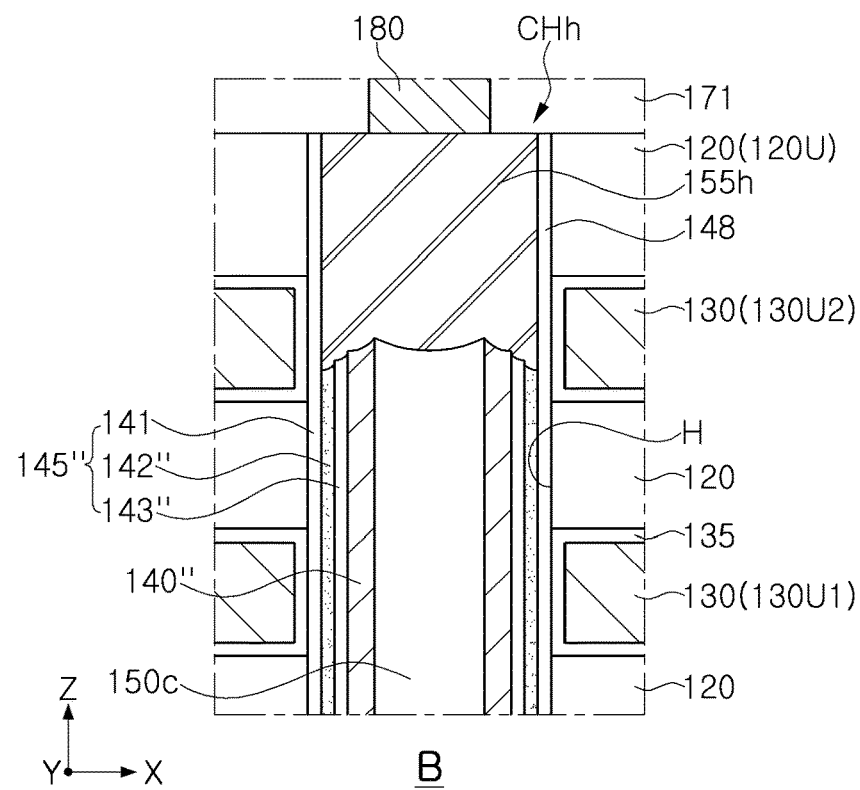

Referring to FIG. 10, the structure of a vertical memory structure CHh may be different from the example embodiment of FIG. 2. The core region 150c may have an upper surface of which a middle portion is concave downwardly from an upper end. A channel layer 140", a second dielectric layer 143", and a data storage layer 142" may have upper ends of which height levels are sequentially lowered from the upper end of the core region 150c. The lower portion of a pad pattern 155h may have a lower surface that covers the concave upper surface of the core region 150c and the inclined upper surfaces of the data storage layer 142", the second dielectric layer 143", and the channel layer 140". FIG. 10 is an exemplary illustration of the shape of the vertical memory structure CHh that may be formed during the etching process, and thus, the shape and arrangement relationship of upper surfaces or upper ends of respective components may be variously changed according to example embodiments.

Figure 11:
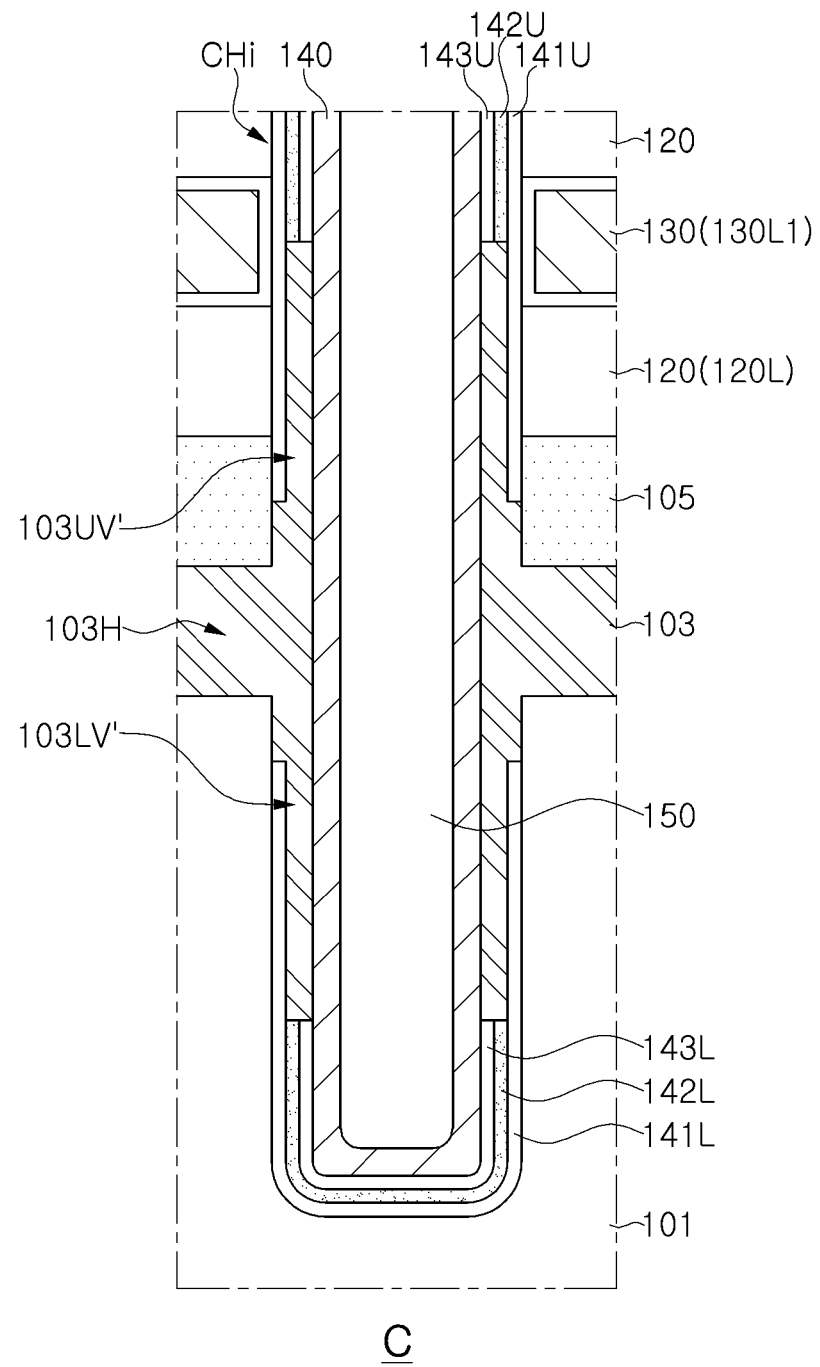
FIG. 11 is a partially enlarged cross-sectional view illustrating an example of a semiconductor device according to an example embodiment.

FIG. 11 is a partially enlarged cross-sectional view illustrating an example of a semiconductor device according to an example embodiment. FIG. 11 illustrates a region corresponding to area C of FIG. 2.

Referring to FIG. 11, unlike the example embodiment of FIG. 2, the channel layer 140 is not divided by the intermediate pattern layer 103, but may penetrate through the upper pattern layer 105 and the intermediate pattern layer 103, and may be extended continuously into the lower pattern layer 101. The intermediate pattern layer 103 may have a horizontal portion 103H, a lower vertical portion 103LV', and an upper vertical portion 103UV.' The lower vertical portion 103LV' and the upper vertical portion 103UV' may contact the outer sidewall of the channel layer 140. The upper vertical portion 103UV' may extend in the vertical direction Z, between the first upper dielectric layer 141U and the channel layer 140, such that the upper end may be located on a level between the upper and lower surfaces of the first lower gate layer 130L1.

FIGS. 12 to 30 are diagrams illustrating a method of forming a semiconductor device according to an example embodiment.

Figure 12:
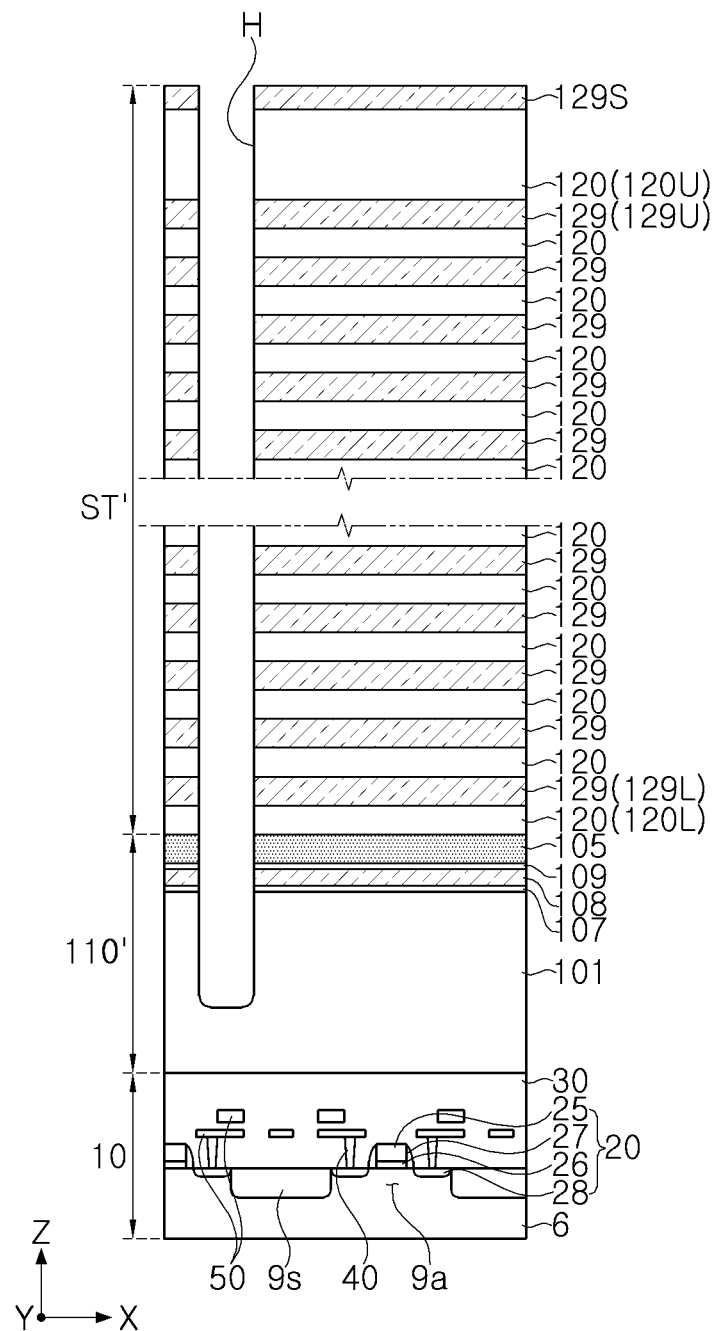
FIGS. 12 to 32 are diagrams illustrating a method of forming a semiconductor device according to an example embodiment.

Referring to FIG. 12, a lower structure 10, a preliminary pattern structure 110', and a preliminary stack structure ST' may be formed. A channel hole H may be formed to extend in the vertical direction Z.

Forming the lower structure 10 may include preparing a substrate 6, forming a device isolation layer 9s to define an active region 9a on the substrate 6, and forming circuit elements 20 and a lower insulating layer 30 on the substrate 6. The circuit elements 20 may include a circuit gate 25, a circuit gate insulating layer 26, a spacer layer 27, and circuit source/drain regions 28 as described with respect to FIG. 2A. The lower insulating layer 30 may cover the circuit elements 20. Circuit contact plugs 40 and circuit wiring lines 50 may be formed in the lower insulating layer 30.

Forming the preliminary pattern structure 110' may include forming a lower pattern layer 101, a first horizontal sacrificial layer 107, a second horizontal sacrificial layer 108, a third horizontal sacrificial layer 109 and an upper pattern layer 105, on the lower structure 10. The first to third horizontal sacrificial layers 107, 108 and 109 may be layers replaced with the intermediate pattern layer 103 through a subsequent process. The second horizontal sacrificial layer 108 may be disposed between the first and third horizontal sacrificial layers 107 and 109. The second horizontal sacrificial layer 108 may be formed of a material having etch selectivity with respect to the first and third horizontal sacrificial layers 107 and 109. For example, the first and third horizontal sacrificial layers 107 and 109 may be formed of an insulating material such as silicon oxide, and the second horizontal sacrificial layer 108 may be formed of an insulating material such as silicon nitride.

Forming a preliminary stack structure ST' may include alternately stacking sacrificial layers 129 and interlayer insulating layers 120 on the preliminary pattern structure 110'. The preliminary stack structure ST' may further include a stopper layer 129S formed on an uppermost interlayer insulating layer 120U. The sacrificial layers 129 may be layers that are replaced with gate layers 130 through a subsequent process. The sacrificial layers 129 may be formed of a material having etch selectivity with respect to the interlayer insulating layers 120. For example, the interlayer insulating layers 120 may be formed of or may include silicon oxide. The sacrificial layers 129 may be formed of a material different from a material of the interlayer insulating layers 120. For example, the sacrificial layers may be formed of or may include a material from silicon, silicon carbide, and silicon nitride. The stopper layer 129S may be formed of the same material as the sacrificial layers 129.

The channel hole H may be formed by anisotropically etching the preliminary stack structure ST.' Due to the height of the preliminary stack structure ST', the inner side surface of the channel hole H may not be perpendicular to the upper surface of the lower structure 10. The channel hole H may extend into the lower pattern layer 101 by penetrating through the upper pattern layer 105 and the first to third horizontal sacrificial layers 107, 108 and 109. Side surfaces of the interlayer insulating layers 120 and the sacrificial layers 129 may be exposed by the channel hole H.

Figure 13:
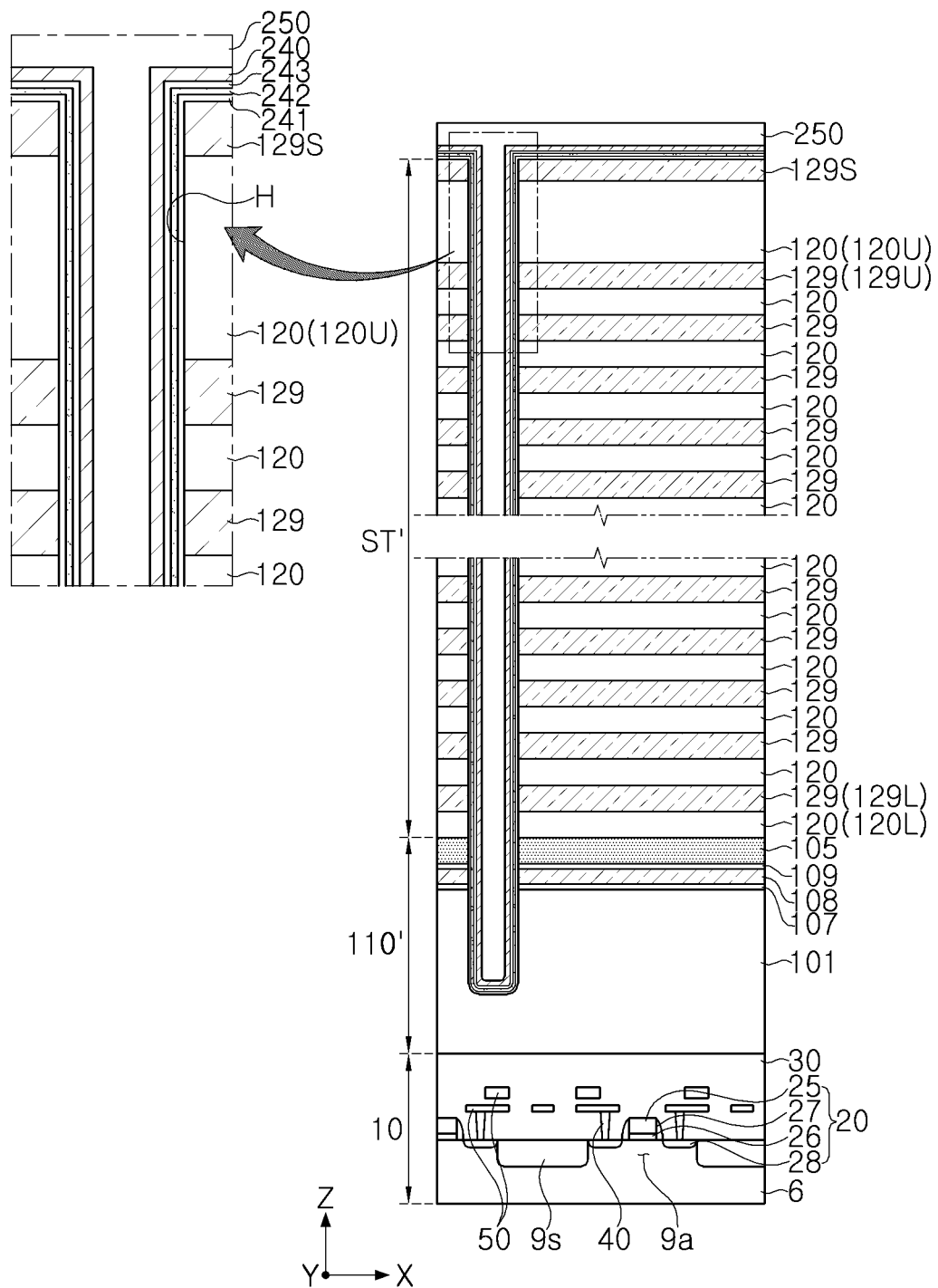

Referring to FIG. 13, a first layer 241, a second layer 242, a third layer 243, a fourth layer 240, and a buried insulating layer 250 may be sequentially formed in the channel hole H.

The first layer 241, the second layer 242, the third layer 243, and the fourth layer 240 are sequentially formed on the inner sidewall of the channel hole H, and the space between the fourth layer 240 in the channel hole H may be filled with the buried insulating layer 250. The first layer 241, the second layer 242, the third layer 243, the fourth layer 240, and the buried insulating layer 250 may be formed to extend in the horizontal directions (X, Y) on an upper portion of the channel hole H, to cover the upper surface of the stopper layer 129S. The first layer 241, the second layer 242, the third layer 243, the fourth layer 240, and the buried insulating layer 250 may be sequentially stacked on the upper surface of the stopper layer 129S. The first layer 241, the second layer 242, the third layer 243, and the fourth layer 240 may be formed to conformally cover the inner sidewall of the channel hole H.

Figure 14:
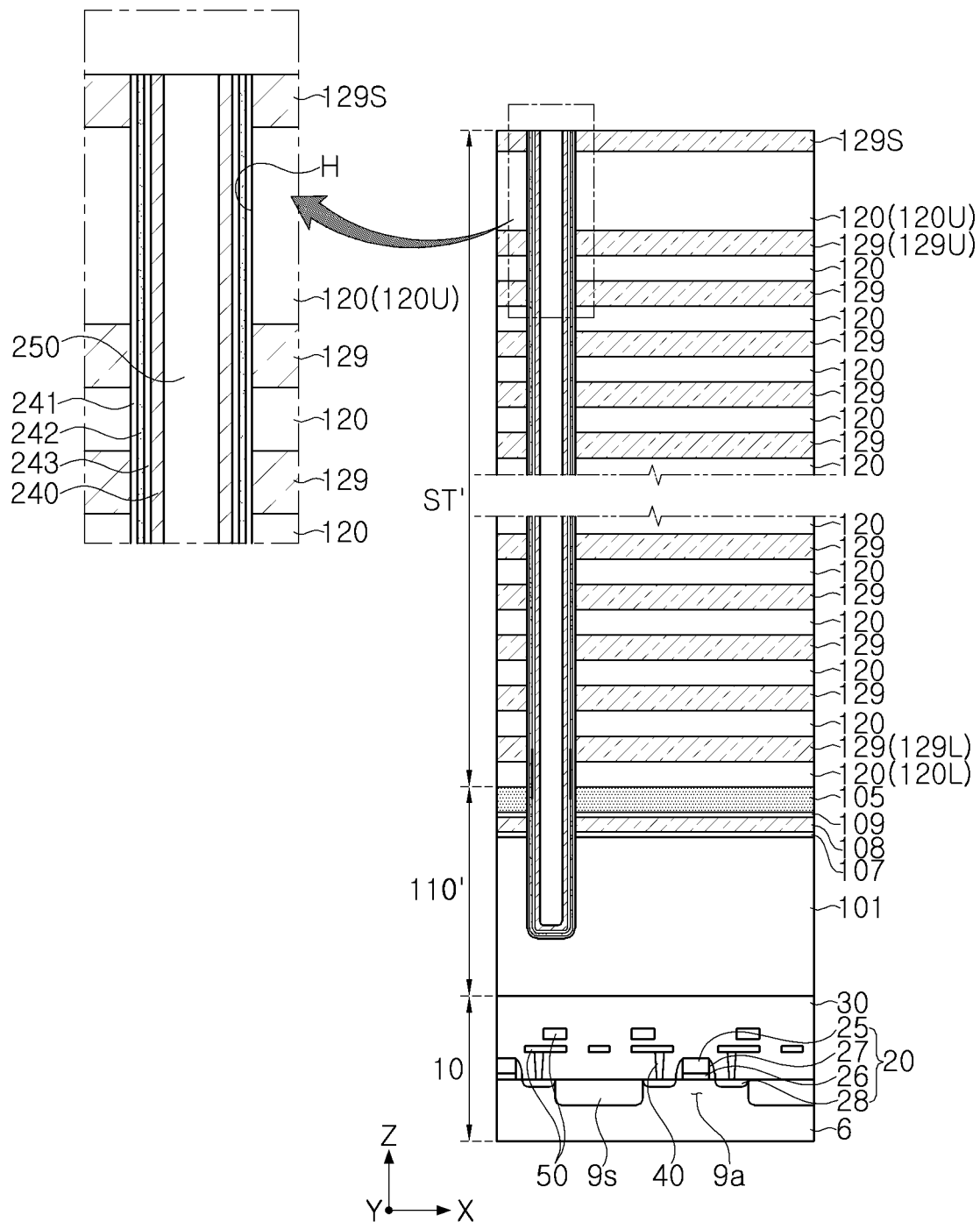

Referring to FIG. 14, portions of the first layer 241, the second layer 242, the third layer 243, the fourth layer 240, and the buried insulating layer 250 may be removed from the stopper layer 129S by performing a planarization process. The planarization process may be a chemical mechanical polishing (CMP) process.

Figure 15:
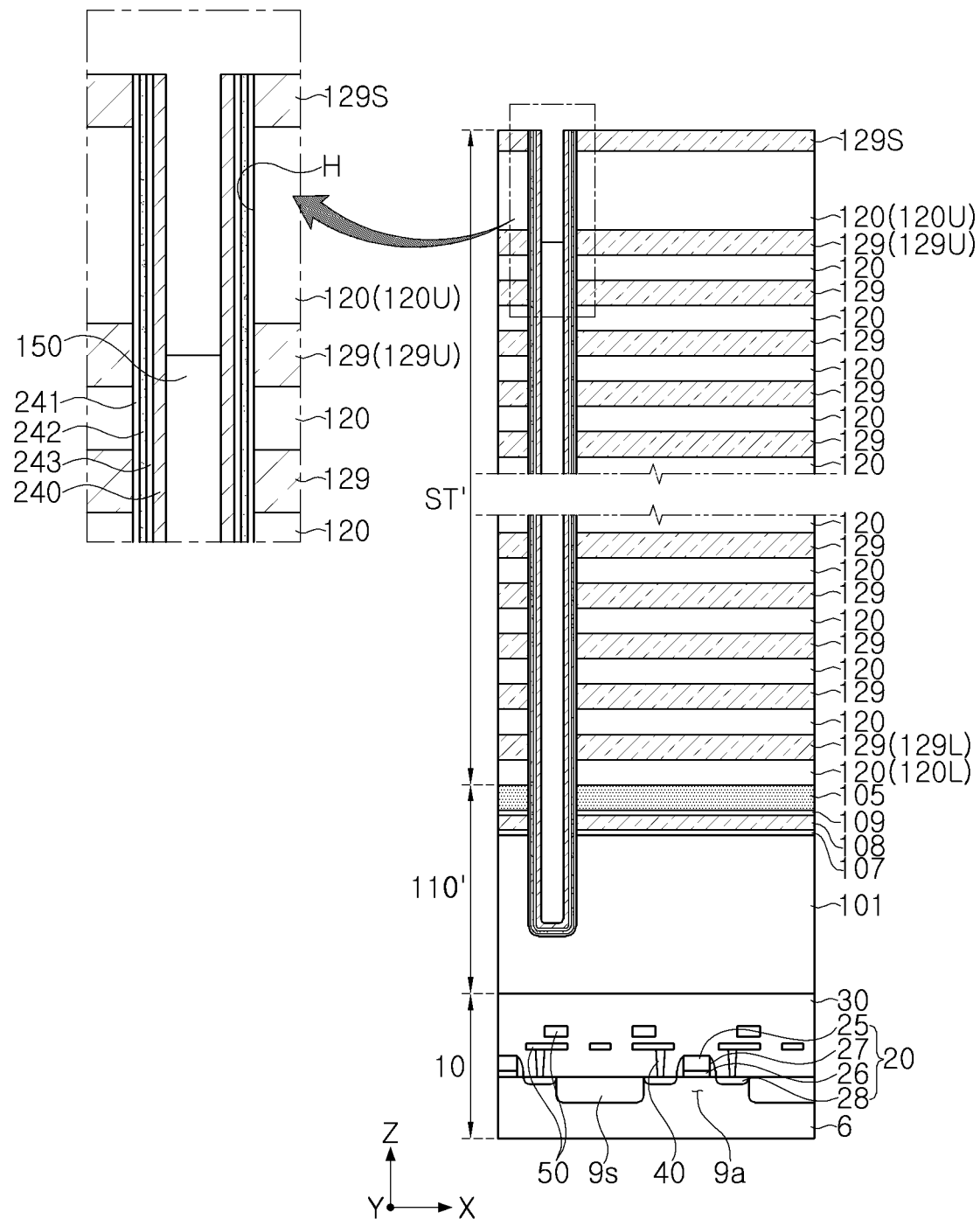

Referring to FIG. 15, a core region 150 may be formed by removing an upper portion of the buried insulating layer 250 by performing an etching process. By the etching process, the upper surface of the core region 150 may be positioned on a level, in the vertical direction Z, between the upper surface and the lower surface of an uppermost sacrificial layer 129U. The uppermost sacrificial layer 129U may be a layer that is replaced with the second upper gate layer 130U2 of FIG. 2A through a subsequent process. The etching process may be an etch back process.

Figure 16:
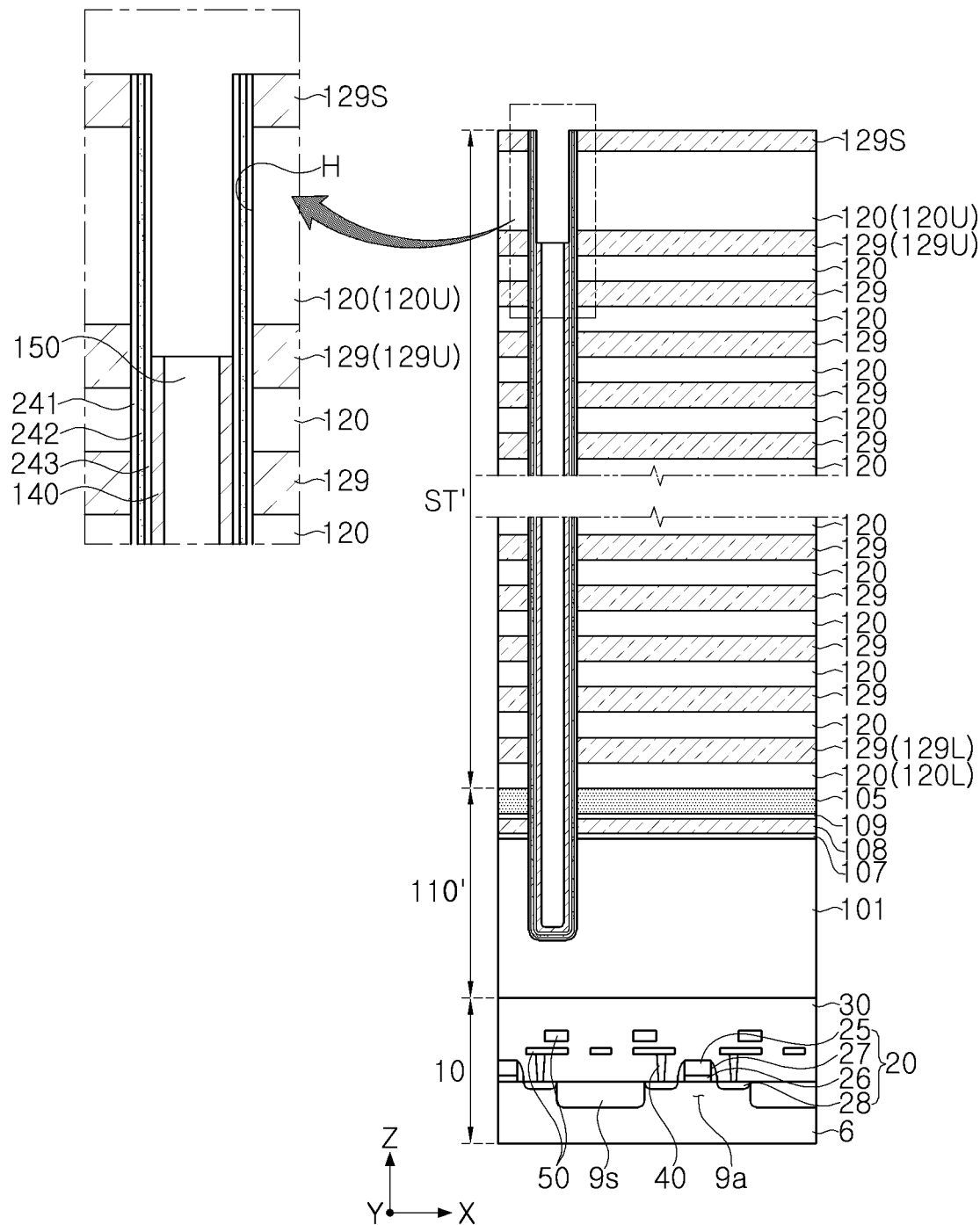

Referring to FIG. 16, a channel layer 140 may be formed by removing an upper portion of the fourth layer 240 by performing an etching process. By the etching process, the upper end or upper surface of the channel layer 140 may be located on a level, in the vertical direction Z, between the upper and lower surfaces of the uppermost sacrificial layer 129U. The upper end of the channel layer 140 may be positioned on substantially the same level as the upper end of the core region 150. In another example, an upper end of the channel layer 140 and an upper end of the core region 150 may be located on different levels.

Figure 17:
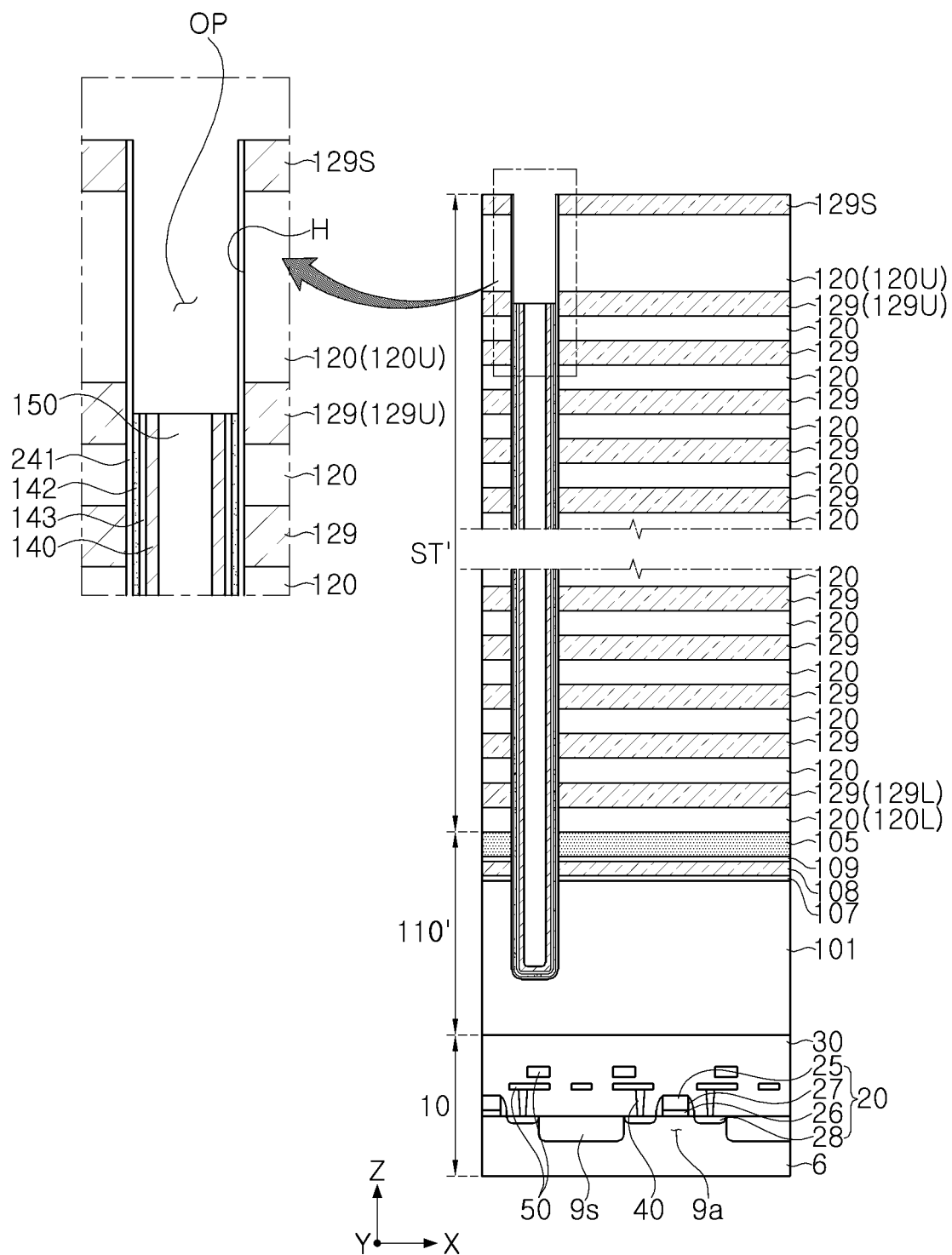

Referring to FIG. 17, by performing an etching process to remove the upper portion of the third layer 243 and the upper portion of the second layer 242, the second dielectric layer 143 and the data storage layer 142 may be formed. By the etching process, the upper end or upper surface of the second dielectric layer 143 and the upper end or upper surface of the data storage layer 142 may be located on a level, in the vertical direction Z, between the upper and lower surfaces of the uppermost sacrificial layer 129U. Accordingly, an opening OP may be formed on the upper portions of the core region 150, the channel layer 140, the second dielectric layer 143 and the data storage layer 142. Forming the second dielectric layer 143 and the data storage layer 142 may include first removing an upper portion of the third layer 243 to form the second dielectric layer 143, and then removing an upper portion of the second layer 242 to form the data storage layer 142.

In FIGS. 15 to 17, by respectively adjusting the depths at which the buried insulating layer 250, the fourth layer 240, the third layer 243 and the second layer 242 are etched from upper portions, the example embodiments of FIGS. 4, 6, 9 and 10 may be obtained. For example, the vertical memory structure CHa of FIG. 4 may be formed by performing an etching process such that the upper surface of the channel layer 140 is located on a lower level than the upper surface of the core region 150.

In another example not illustrated, through the manufacturing operations of FIGS. 15 to 17, an etching process may be performed, in such a manner that the upper surface of the core region 150, the upper surface of the channel layer 140, the upper surface of the second dielectric layer 143, and the upper surface of the data storage layer 142 may be located on a level lower than the lower surface of the uppermost sacrificial layer 129U. Through a subsequent process, the upper portion of the vertical memory structure CH may have a structure different from that of the area B of FIG. 2, and the lower portion of the vertical memory structure CH may have the structure illustrated in the area C of FIG. 2.

In detail, through a subsequent process, the lower portion of the vertical memory structure CH has the structure illustrated in area C of FIG. 2, and in the manufacturing operations of FIGS. 15 to 17, the upper structure of the vertical memory structure CH may be variously modified by respectively adjusting the depths at which the upper portions of the buried insulating layer 250, the fourth layer 240, the third layer 243, and the second layer 242 are etched from the upper portion.

Figure 18:
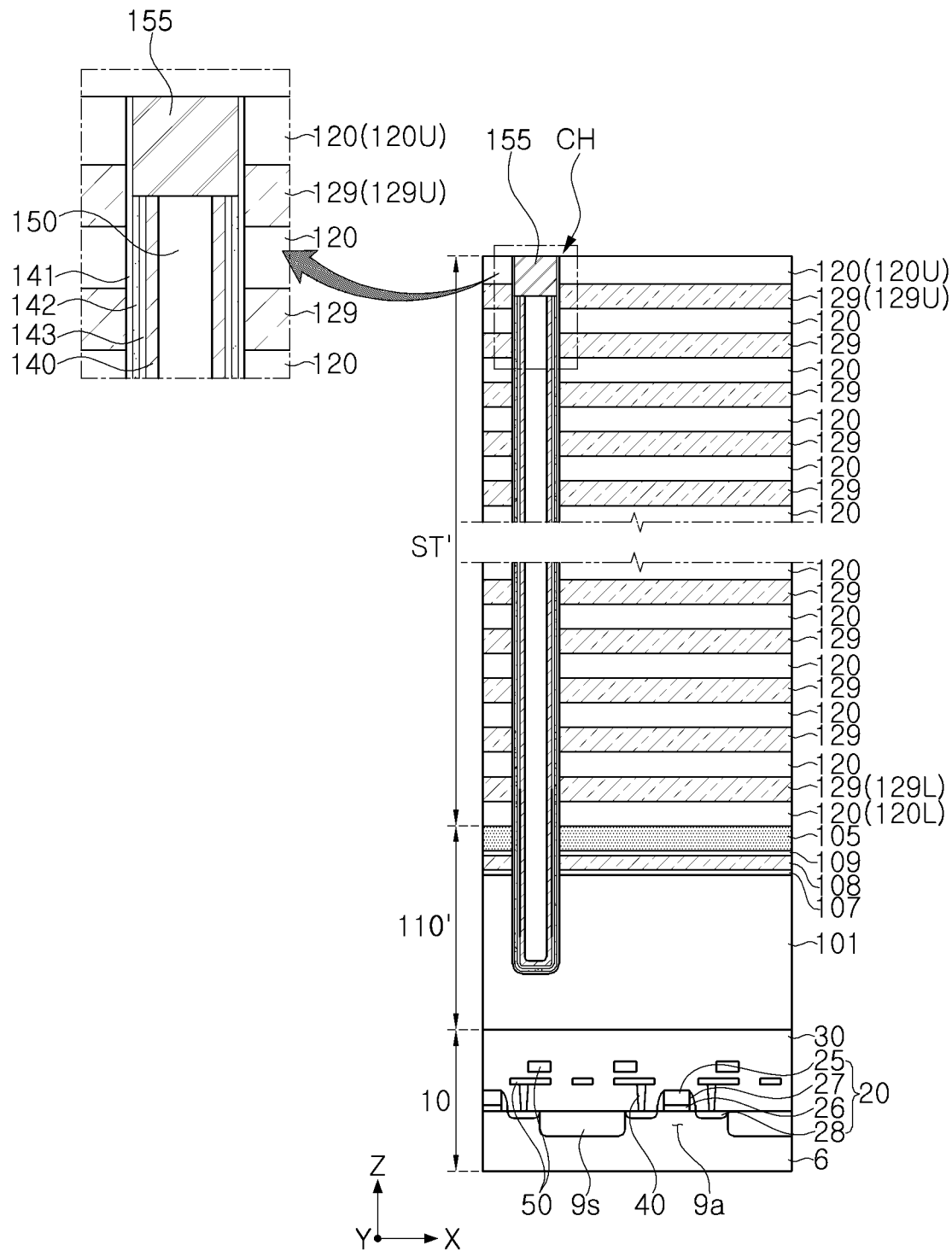

Referring to FIG. 18, a pad pattern 155 may be formed by forming a semiconductor pattern in the opening OP and performing a planarization process. A first dielectric layer 141 may be formed by removing the upper portion of the first layer 241 by the planarization process. The side surface of the pad pattern 155 may be covered by and in contact with the inner side surface of the first dielectric layer 141. The pad pattern 155 may be formed on the core region 150 to cover upper surfaces of the data storage layer 142, the second dielectric layer 143, and the channel layer 140. The pad pattern 155 may include silicon having N-type conductivity, for example, polysilicon. The upper surface of the pad pattern 155 may be substantially coplanar with the upper surface of the uppermost interlayer insulating layer 120U.

In the operation of forming the pad pattern 155, impurities may be implanted in-situ. The impurity may include, for example, at least one of boron (B), phosphorus (P), arsenic (As), and carbon (C). Depending on example embodiments, the type, concentration, and/or implantation depth of the impurity may be variously changed.

In another example, prior to forming the pad pattern 155, an insulating layer 148 may be formed. The insulating layer 148 may be formed by forming an insulating material layer in the opening OP by a deposition process and by removing a portion of the insulating material layer covering the channel layer 140 and the core region 150 by a trim process. Alternatively, the insulating layer 148 may be formed by forming a layer including, for example, SiON, in the opening OP, and then partially oxidizing the layer. Thus, the example embodiments of FIGS. 5, 6, 8A and 8B may be obtained.

Figure 19:
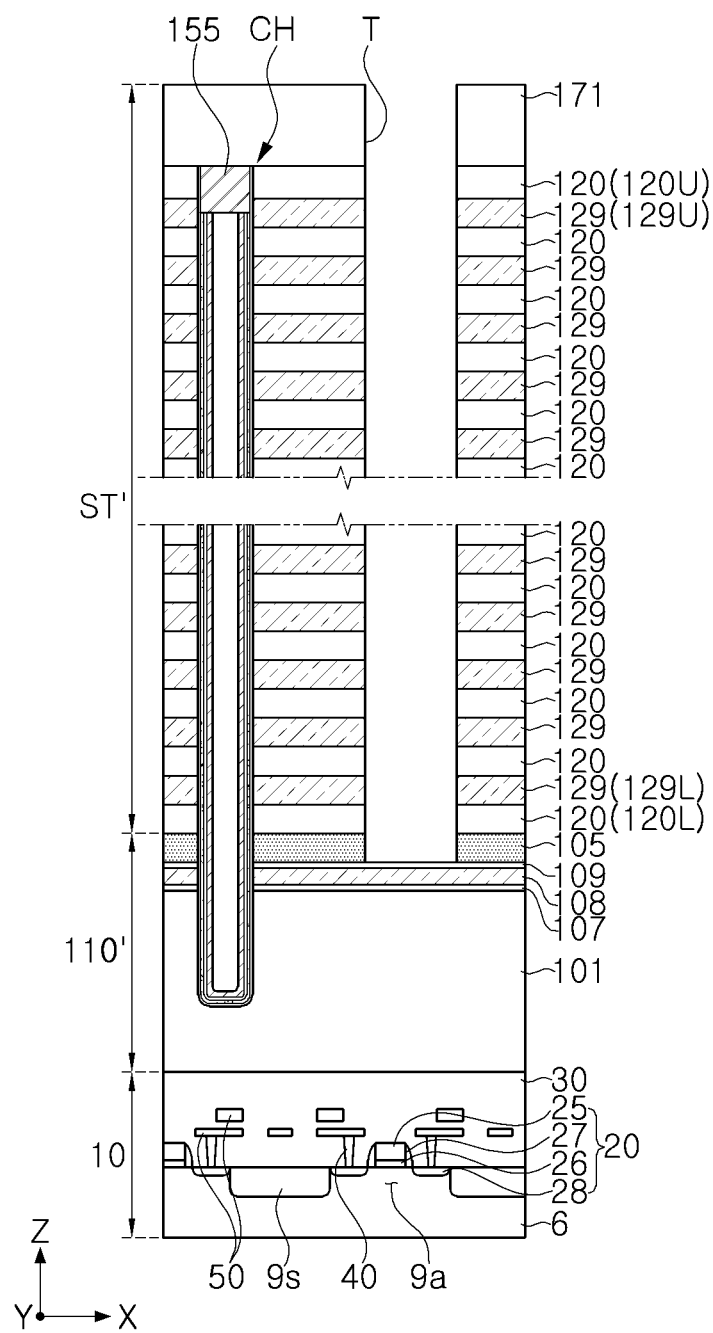

Referring to FIG. 19, a first capping insulating layer 171 may be formed, and an isolation trench T extending in a vertical direction Z may be formed.

The isolation trench T may be formed by forming a mask layer using a photolithography process and anisotropically etching a preliminary stack structure ST' of the sacrificial layers 129 and the interlayer insulating layers 120. The isolation trench T may extend in the second direction (Y direction). The isolation trench T may penetrate through the upper pattern layer 105 to expose a portion of the upper surface of the third horizontal sacrificial layer 109.

Figure 20:
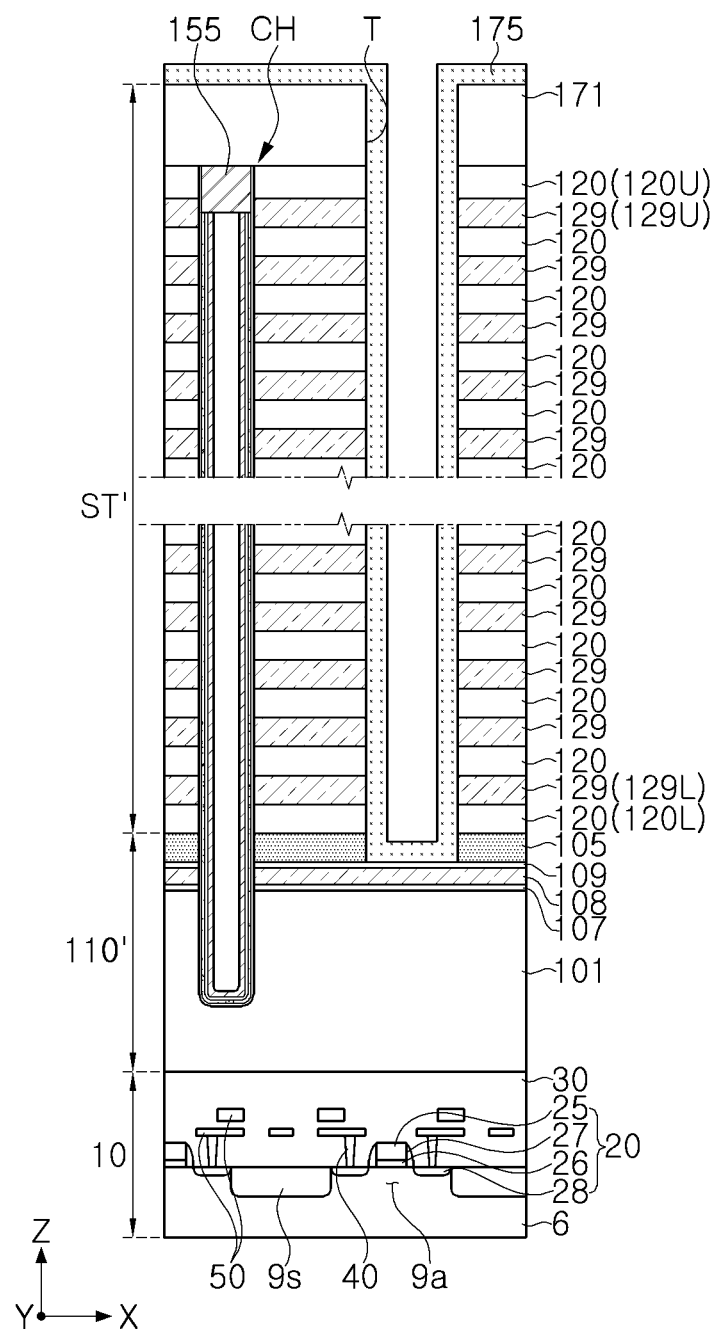

Referring to FIG. 20, a first sacrificial spacer 175 may be formed in the isolation trench T. The first sacrificial spacer 175 may be formed to extend in the horizontal directions (X, Y), on the isolation trench T, to cover the upper surface of the first capping insulating layer 171. The first sacrificial spacer 175 may be formed to conformally cover the inner sidewall of the isolation trench T. The first sacrificial spacer 175 may include or may be formed of, for example, polysilicon.

Figure 21:
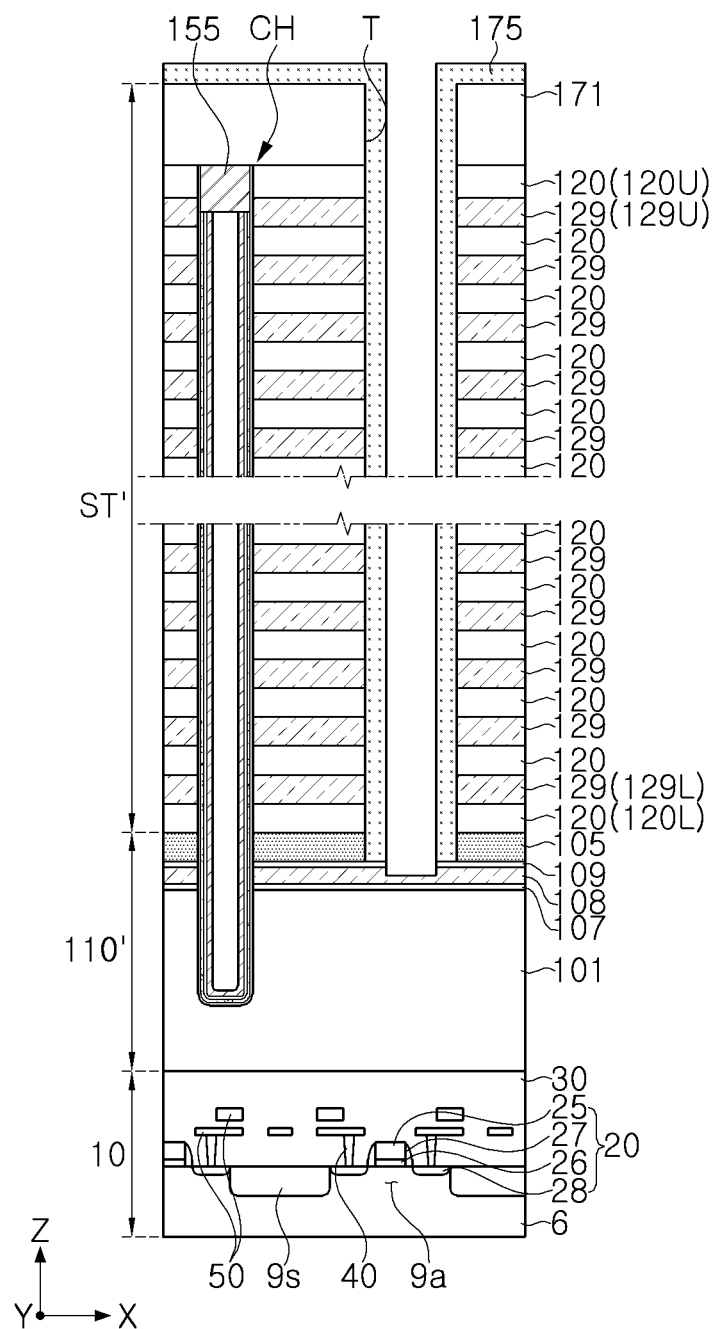

Referring to FIG. 21, the second horizontal sacrificial layer 108 may be exposed by removing a lower portion of the first sacrificial spacer 175 and a portion of the third horizontal sacrificial layer 109 by performing an etchback process. A side surface of the third horizontal sacrificial layer 109 may be exposed by the etch-back process. During the etchback process, the preliminary stack structure ST' may be protected by the first sacrificial spacer 175.

Figure 22:
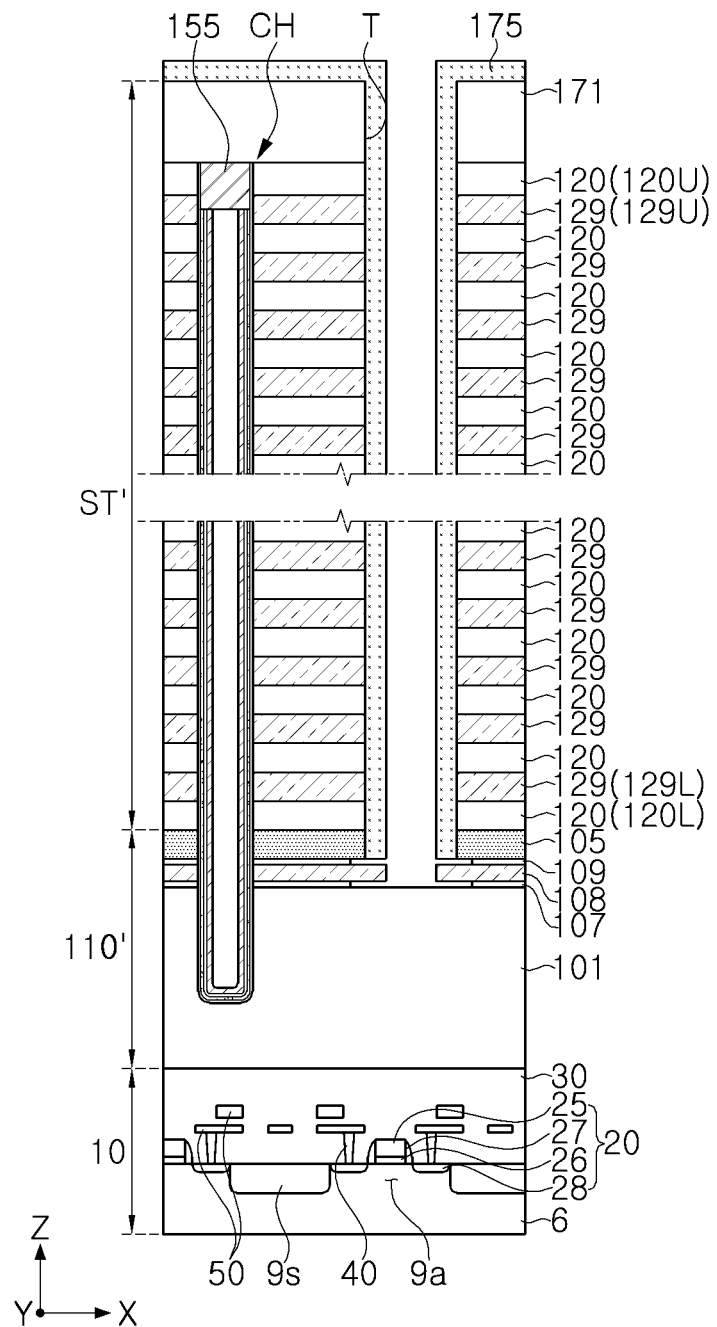

Referring to FIG. 22, portions of the first horizontal sacrificial layer 107 and the third horizontal sacrificial layer 109 may be removed by a wet etching process. The first horizontal sacrificial layer 107 and the third horizontal sacrificial layer 109 may be removed selectively with respect to the second horizontal sacrificial layer 108 by the wet etching process.

Figure 23:
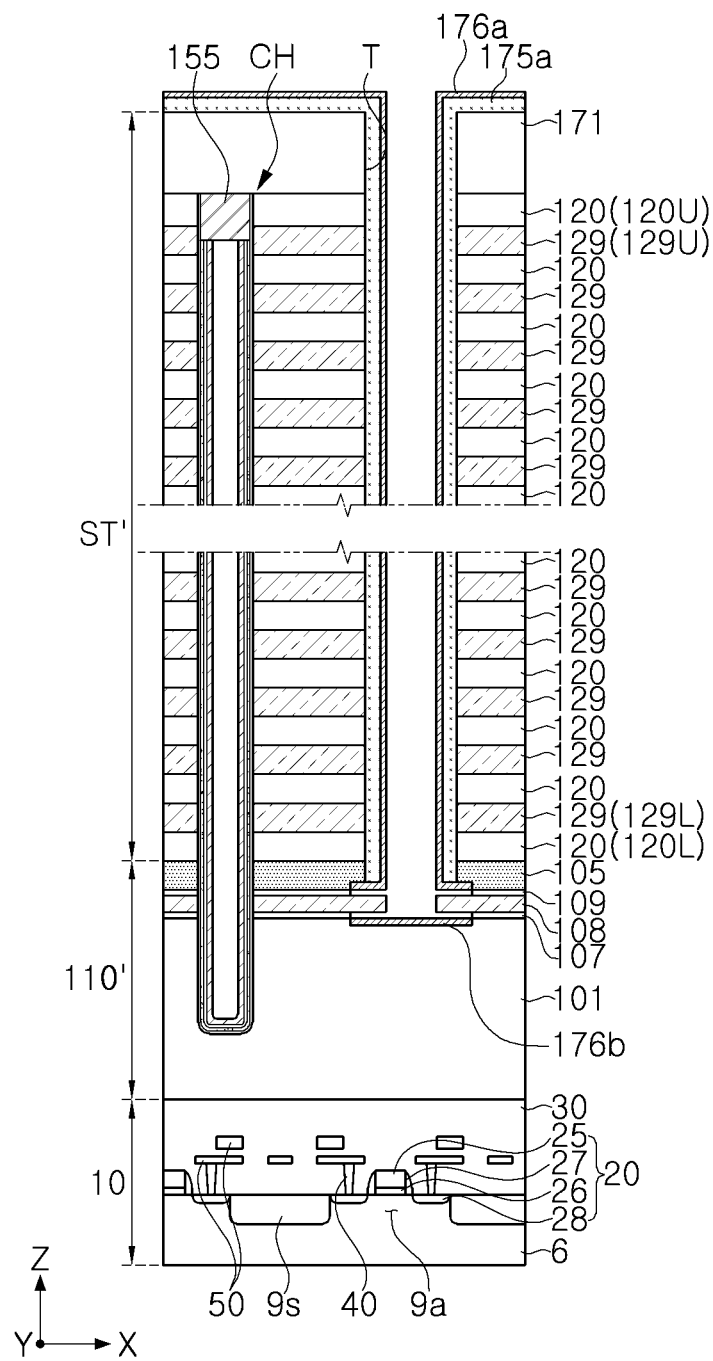

Referring to FIG. 23, first and second oxide layers 176a and 176b may be formed by performing a first wet oxidation process. By the first wet oxidation process, the first sacrificial spacer 175 may be partially oxidized inwardly from the exposed sidewall, thereby forming a second sacrificial spacer 175a and the first oxide layer 176a. A portion of the upper pattern layer 105 may also be oxidized to form a portion of the first oxide layer 176a. The first oxide layer 176a may be formed to extend in the vertical direction Z and to extend in the first direction (X direction) while covering the lower surface of the second sacrificial spacer 175a. The second oxide layer 176b may be a layer formed by partially oxidizing the upper portion of the lower pattern layer 101.

Figure 24:
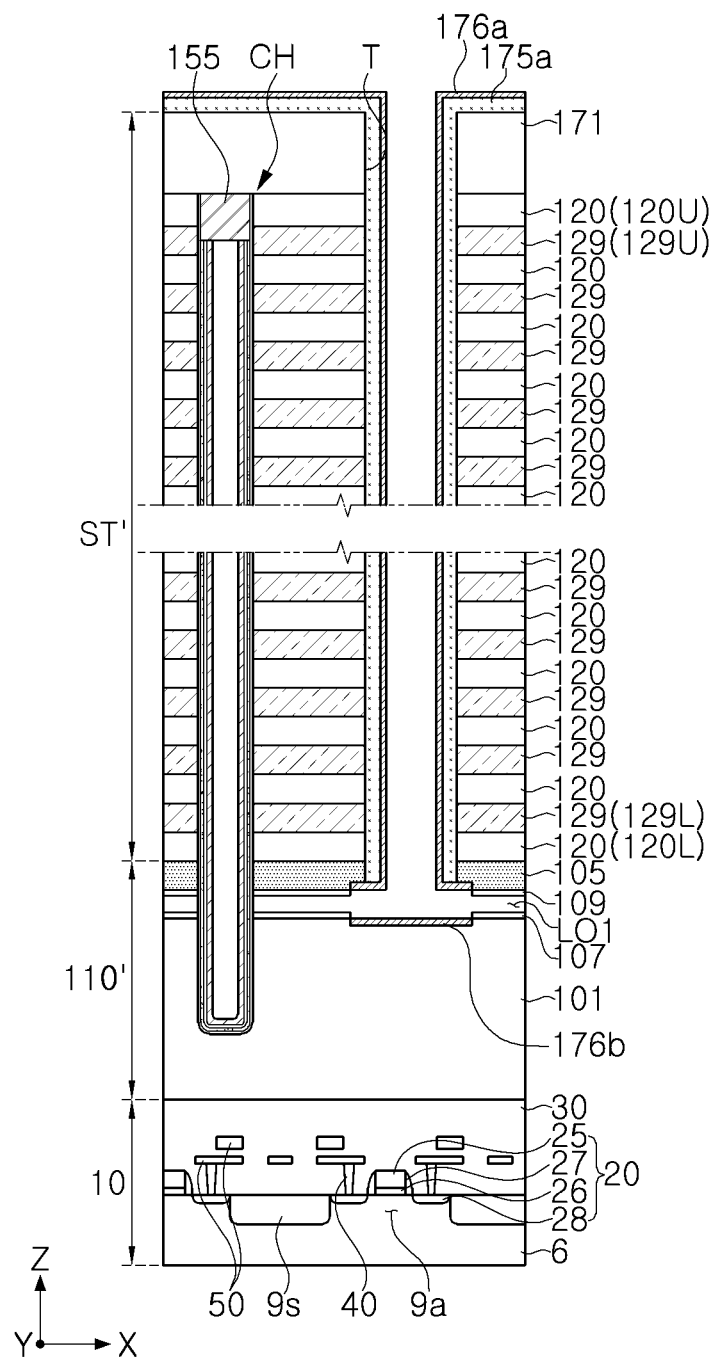

Referring to FIG. 24, the second horizontal sacrificial layer 108 may be removed. The second horizontal sacrificial layer 108 may be selectively removed with respect to the first horizontal sacrificial layer 107 and the third horizontal sacrificial layer 109. A first horizontal opening LO1 may be formed between the first horizontal sacrificial layer 107 and the third horizontal sacrificial layer 109 by removing the second horizontal sacrificial layer 108.

Figure 25:
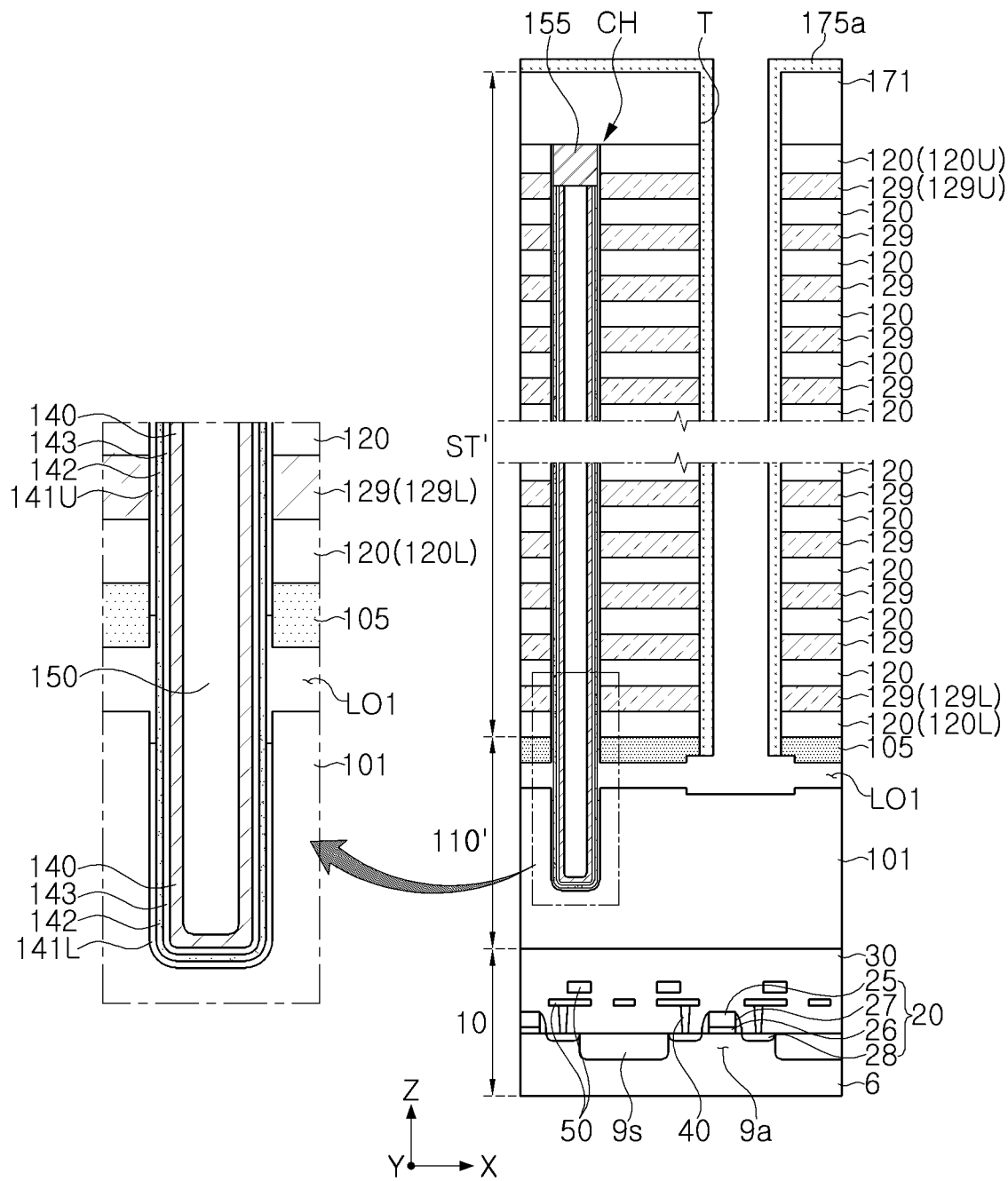

Referring to FIG. 25, a portion of the first dielectric layer 141 and the first horizontal sacrificial layer 107 and the third horizontal sacrificial layer 109 is removed through the first horizontal opening LO1, and the first and second oxide layers 176a and 176b may be removed. The first dielectric layer 141 may be partially removed from the first horizontal opening LO1 in the vertical direction Z and may be divided into a first lower dielectric layer 141L and a first upper dielectric layer 141U. As the first and second oxide layers 176a and 176b are removed, a step may be formed on the upper pattern layer 105 and the lower pattern layer 101.

Figure 26:
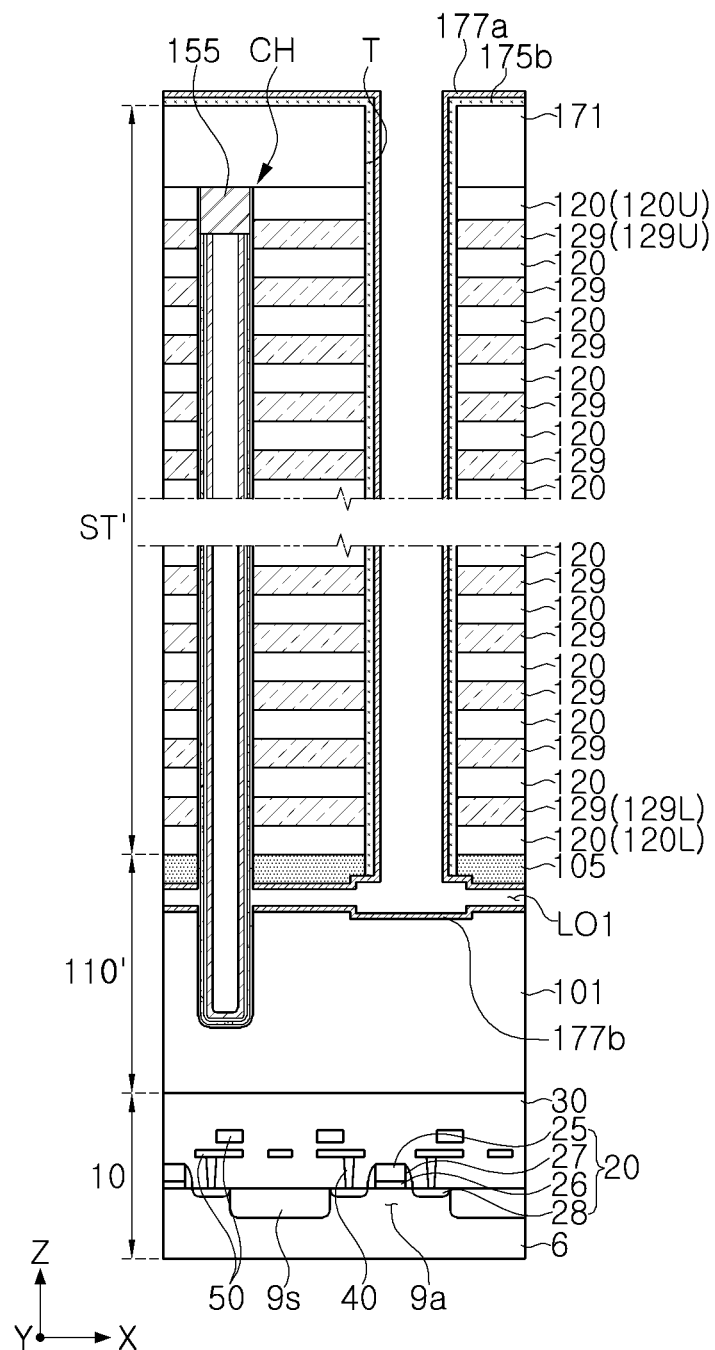

Referring to FIG. 26, third and fourth oxide layers 177a and 177b may be formed by performing a second wet oxidation process. By the second wet oxidation process, a portion of the second sacrificial spacer 175a may be oxidized inwardly from the exposed sidewall, whereby the third sacrificial spacer 175b and the third oxide layer 177a may be formed. A portion of the upper pattern layer 109 may also be oxidized to form a portion of the third oxide layer 177a. The third oxide layer 177a is formed to extend in the vertical direction Z and extend in the first direction (X direction) while covering the lower surface of the third sacrificial spacer 175b and the lower surface of the lower pattern layer 105. The fourth oxide layer 177b may be a layer formed by oxidizing the upper portion of the lower pattern layer 101.

Figure 27:
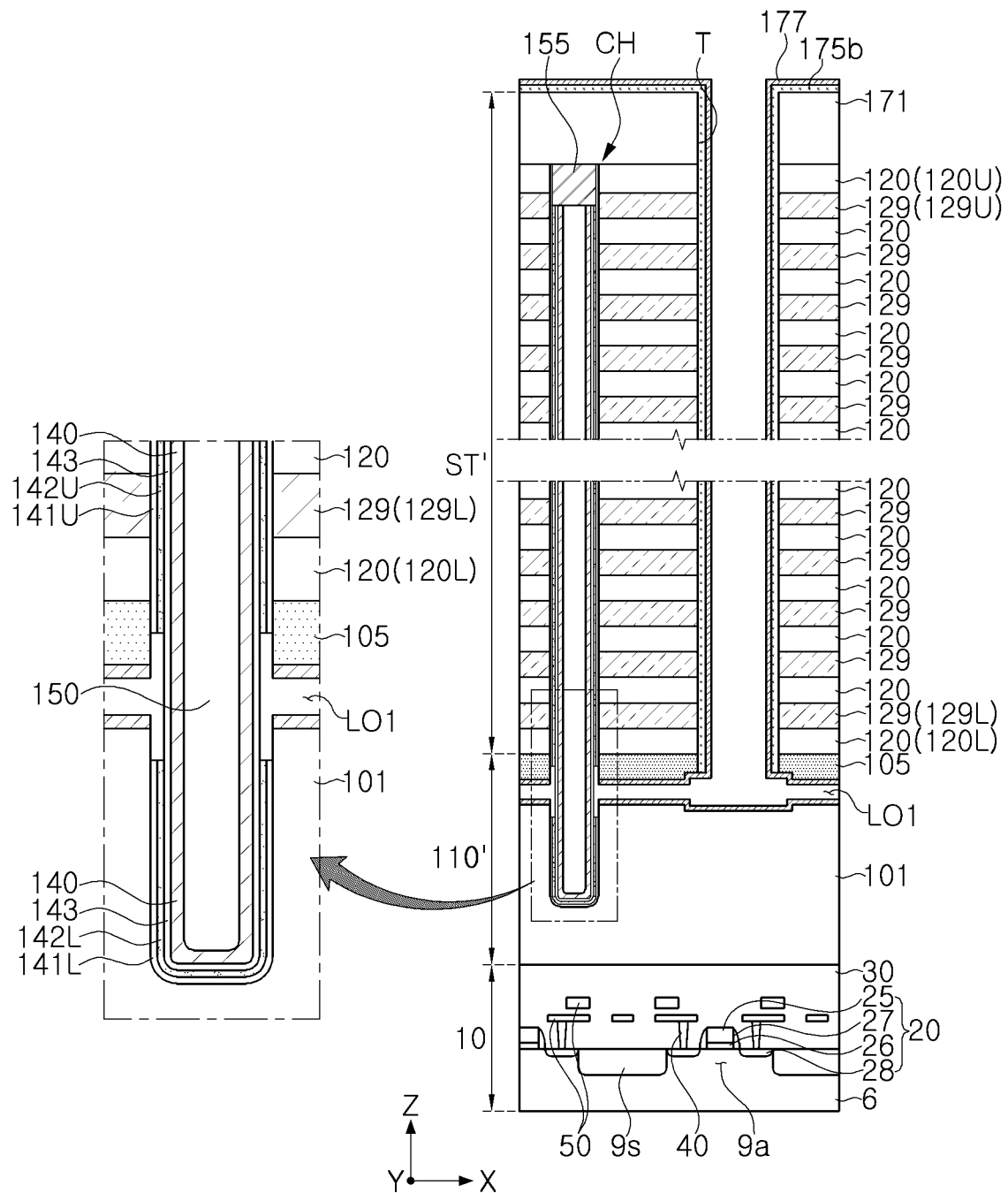

Referring to FIG. 27, a portion of the data storage layer 142 may be removed through the first horizontal opening LO1. The data storage layer 142 may be partially removed from the first horizontal opening LO1 and may be divided into a lower data storage layer 142L and an upper data storage layer 142U.

Figure 28:
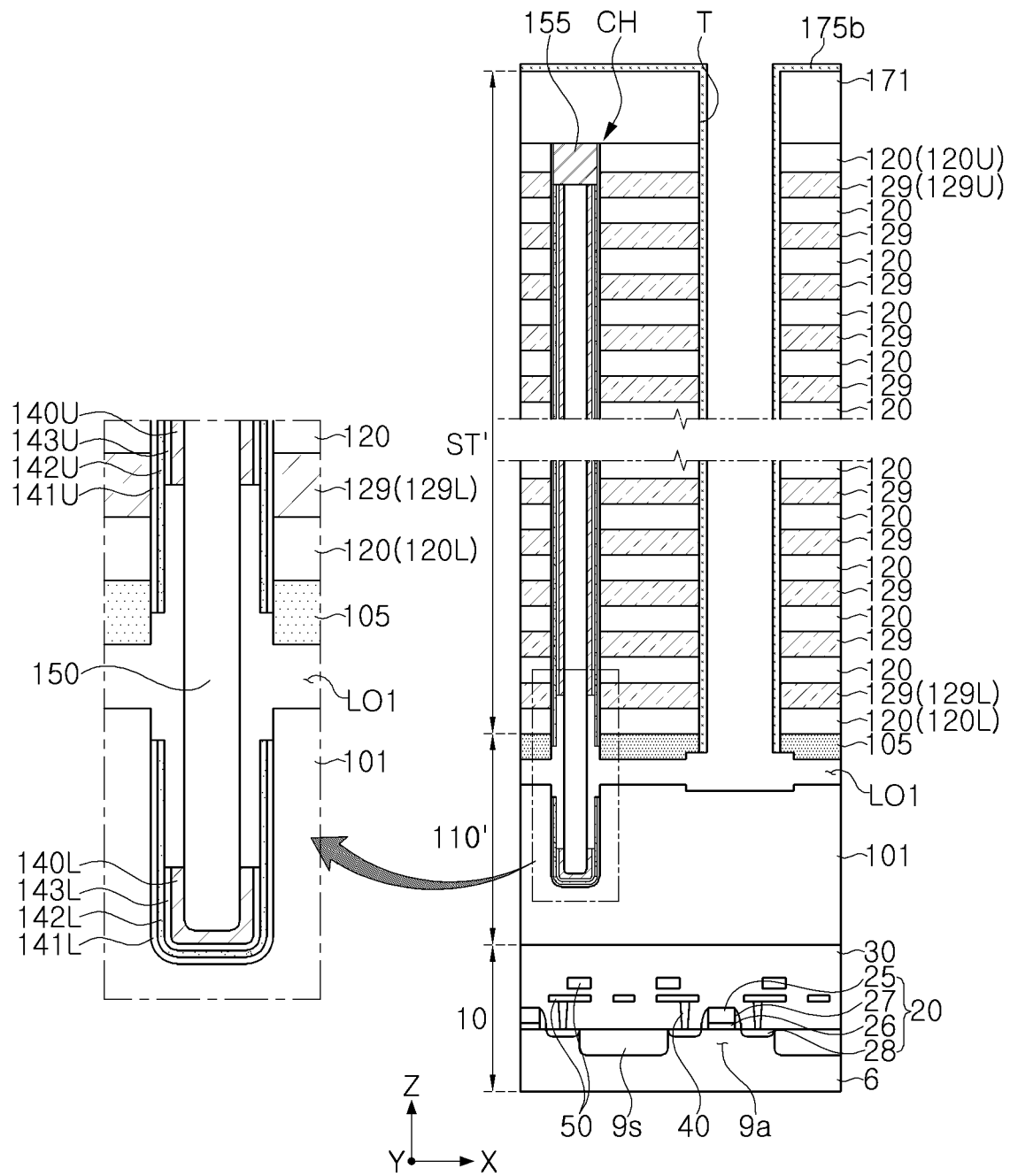

Referring to FIG. 28, a portion of the second dielectric layer 143 and a portion of the channel layer 140 may be removed through the first horizontal opening LO1. In this operation, the third and fourth oxide layers 177a and 177b may also be removed. The second dielectric layer 143 and the channel layer 140 may be partially removed from the first horizontal opening LO1 to be divided into a second lower dielectric layer 143L and a first upper dielectric layer 143U and into a lower channel layer 140L and an upper channel layer 140U, respectively. A side surface of the core region 150 may be exposed. A lower end of the second upper dielectric layer 143U and a lower end of the upper channel layer 140U may be located on a level, in the vertical direction Z, between the upper and lower surfaces of a lowermost sacrificial layer 129L.

In this operation, when a subsequent process is performed without removing a portion of the channel layer 140, the example embodiment of FIG. 11 may be obtained.

Figure 29:
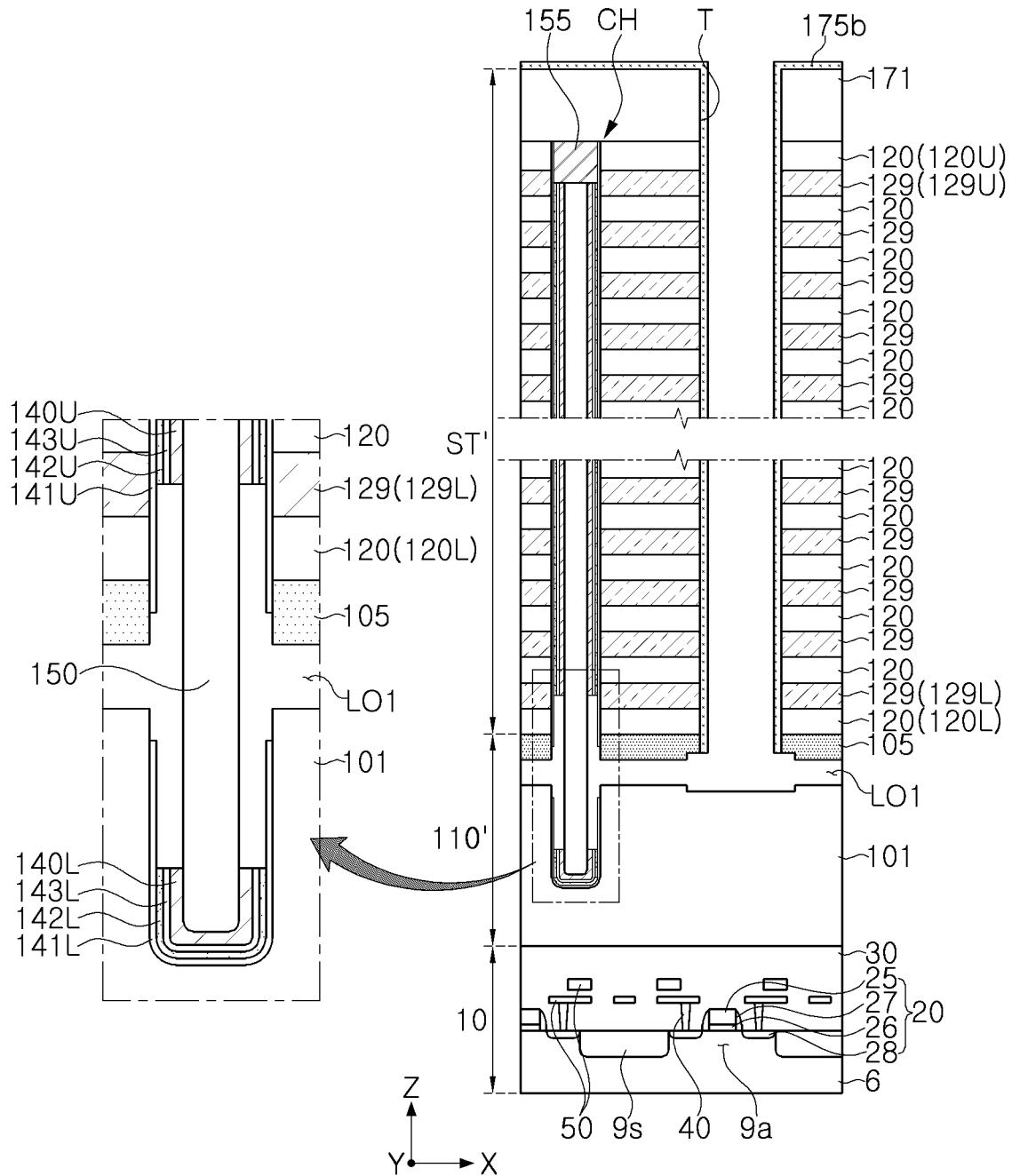

Referring to FIG. 29, portions of the upper and lower data storage layers 142U and 142L may be removed through the first horizontal opening LO1. The lower end of the upper data storage layer 142U may be located on a level between the upper and lower surfaces of the lowermost sacrificial layer 129L.

Figure 30:
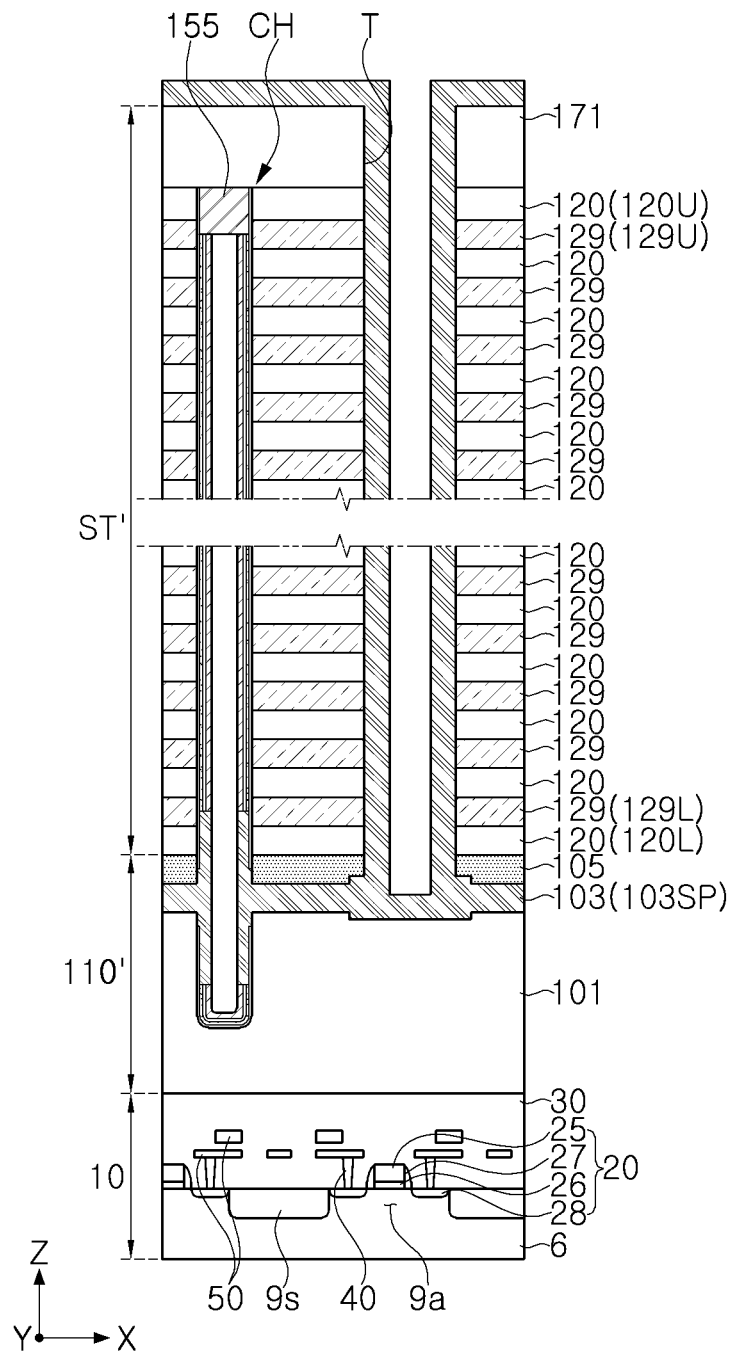

Referring to FIG. 30, a preliminary intermediate pattern layer 103SP may be formed. The preliminary intermediate pattern layer 103SP may fill the first horizontal opening LO1 between the lower pattern layer 101 and the upper pattern layer 105, and may fill the region from which the portions of the first dielectric layer 141, the data storage layer 142, the second dielectric layer 143 and the channel layer 140 have been removed. The preliminary intermediate pattern layer 103SP may be formed to extend in the vertical direction Z within the channel hole H to contact the channel layer 140. The preliminary intermediate pattern layer 103SP may be formed to cover the inner sidewall of the isolation trench T. The preliminary intermediate pattern layer 103SP may be formed of polysilicon.

In another example, through the manufacturing operations of FIGS. 25 to 30, the etching process may be performed in such a manner that the lower end of the upper channel layer 140U, the lower end of the second upper dielectric layer 143U, and the lower end of the upper data storage layer 142U may be positioned, for example, on a level, in the vertical direction Z, higher than the upper surface of the lowermost sacrificial layer 129L or on a level lower than the lower surface of the lowermost sacrificial layer 129L. In this case, the lower portion of the vertical memory structure CH may have a structure different from that of the area C of FIG. 2, but the upper portion of the vertical memory structure CH may have the structure illustrated in the area B of FIG. 2 through the manufacturing operations of FIGS. 12 to 18.

In detail, through the manufacturing operations of FIGS. 12 to 18, the upper portion of the vertical memory structure CH may be formed to have the structure illustrated in area B of FIG. 2, and in the manufacturing operations of FIGS. 25 to 30, the lower structure of the vertical memory structure CH may be variously modified by respectively adjusting the degree to which the channel layer 140, the second dielectric layer 143 and the data storage layer 142 are removed through the first horizontal opening OP1.

Figure 31:
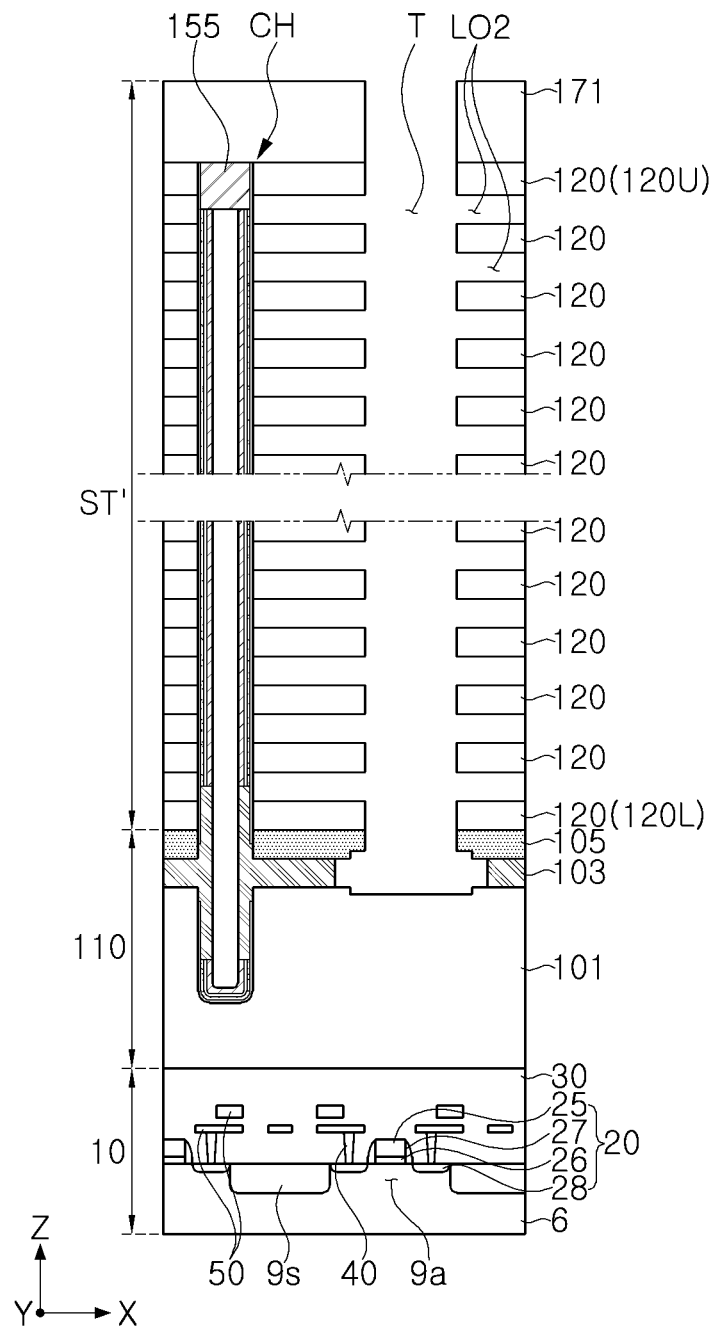

Referring to FIG. 31, a portion of the preliminary intermediate pattern layer 103SP in the isolation trench T is removed to form the intermediate pattern layer 103, and the sacrificial layers 129 may be removed through the isolation trench T. A portion of the side surface of the vertical memory structure CH may be exposed through second horizontal openings LO2 from which the sacrificial layers 129 have been removed. The sacrificial layers 129 may be selectively removed with respect to the interlayer insulating layers 120, using, for example, wet etching. In this operation, the pattern structure 110 including the lower pattern layer 101, the intermediate pattern layer 103, and the upper pattern layer 105 may be formed.

Figure 32:
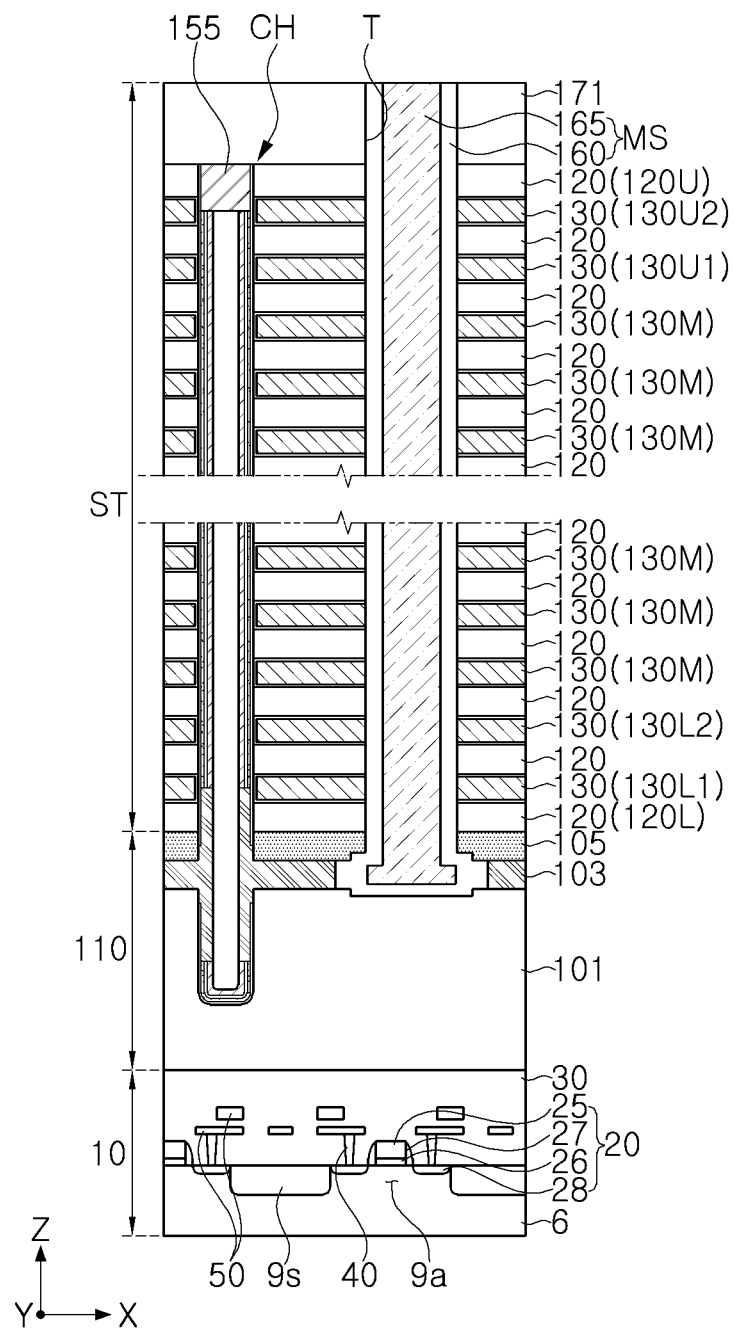

Referring to FIG. 32, the gate layers 130 may be formed in the second horizontal openings LO2 from which the sacrificial layers 129 have been removed, and the separation structure MS may be formed in the isolation trench T. Before forming the gate layers 130, a barrier layer 135 may be first formed in the second horizontal openings L02. The separation structure MS may include an isolation spacer 160 and a separation core pattern 165. In this operation, a stack structure ST including the interlayer insulating layers 120 and the gate layers 130 may be formed.

Referring to FIG. 2A together, a second capping insulating layer 172 may be formed, and a contact plug 180 and a bit line 190 may be formed. The second capping insulating layer 172 may be formed of an insulating material. The contact plug 180 and the bit line 190 may be formed of a conductive material.

As set forth above, a semiconductor device having improved electrical characteristics may be provided by selectively removing a portion of a data storage structure to adjust a horizontal thickness of a layer interposed between a gate electrode and a pad pattern.

While example embodiments have been illustrated and described above, it will be apparent to those skilled in the art that modifications and variations could be made without departing from the scope of the present inventive concept as defined by the appended claims.

What is claimed is:

1. A semiconductor device comprising:
a lower structure including a substrate, and circuit elements on the substrate;
a pattern structure disposed on the lower structure and including a lower pattern layer, an intermediate pattern layer on the lower pattern layer, and an upper pattern layer on the intermediate pattern layer;
a stack structure including gate layers and interlayer insulating layers alternately stacked on the pattern structure in a vertical direction; and
a vertical memory structure penetrating through the stack structure in the vertical direction and in contact with the pattern structure,
wherein the vertical memory structure includes,
a core region;
a channel layer on a side surface and a bottom surface of the core region;
a data storage structure on an outer side surface and a bottom surface of the channel layer; and
a pad pattern contacting the channel layer, on the core region,
the data storage structure includes a first dielectric layer, a second dielectric layer and a data storage layer between the first dielectric layer and the second dielectric layer,
the first dielectric layer is adjacent to the gate layers and the second dielectric layer is in contact with the channel layer,
an upper end of the data storage layer and an upper end of the second dielectric layer overlap an uppermost gate layer among the gate layers in a first direction perpendicular to the vertical direction, and
the upper end of the data storage layer, the upper end of the second dielectric layer, and a bottom surface of the pad pattern are at a lower level than an upper surface of the uppermost gate layer,
wherein the core region extends into the lower pattern layer while penetrating through the upper pattern layer and the intermediate pattern layer,
the intermediate pattern layer includes a horizontal portion and upper and lower vertical portions connected to the horizontal portion and extending in the vertical direction,
the horizontal portion and the upper and lower vertical portions contact the side surface of the core region, and
an upper end of the upper vertical portion overlaps a lowermost gate layer among the gate layers in the first direction.

2. The semiconductor device of claim 1, wherein the data storage layer has a lower surface in contact with the upper end of the upper vertical portion, and the lower surface of the data storage layer is positioned, in the vertical direction, at a level higher than a lower surface of the lowermost gate layer.

3. The semiconductor device of claim 1, wherein the second dielectric layer has a lower surface in contact with the upper end of the upper vertical portion, and the lower surface of the second dielectric layer is positioned, in the vertical direction, at a level higher than a lower surface of the lowermost gate layer.

4. The semiconductor device of claim 1, further comprising first and second capping insulating layers covering the stack structure;
a contact plug penetrating through the first and second capping insulating layers and connected to the pad pattern; and
a bit line connected to the contact plug.

* * * * *